United States Patent [19]
Wada et al.

[11] Patent Number: 5,923,072
[45] Date of Patent: Jul. 13, 1999

[54] SEMICONDUCTOR DEVICE WITH METALLIC PROTECTIVE FILM

[75] Inventors: Jun Wada, Kawasaki; Toshihiro Ogihara, Yamanashi, both of Japan

[73] Assignee: Fujitsu Limited, Kawashaki, Japan

[21] Appl. No.: 08/963,116

[22] Filed: Oct. 28, 1997

Related U.S. Application Data

[63] Continuation of application No. 08/515,938, Aug. 16, 1995, abandoned.

[30] Foreign Application Priority Data

Aug. 19, 1994 [JP] Japan ................................. 6-195460

[51] Int. Cl.$^6$ ............................. H01L 29/80; H01L 29/46
[52] U.S. Cl. ....................... 257/473; 257/192; 257/280; 257/750
[58] Field of Search ........................... 257/750, 76, 194, 257/200, 267, 279–285, 446, 449, 452, 453, 454–457, 473, 508, 643, 642, 192

[56] References Cited

U.S. PATENT DOCUMENTS

| | | | |
|---|---|---|---|
| 4,213,840 | 7/1980 | Omori et al. | 257/486 |
| 4,316,201 | 2/1982 | Christou et al. | 257/473 |
| 4,319,258 | 3/1982 | Harnagel et al. | 257/453 |
| 4,398,344 | 8/1983 | Gould | 257/473 |
| 4,401,966 | 8/1983 | Ohmura et al. | 257/425 |
| 4,694,564 | 9/1987 | Enoki et al. | 257/473 |
| 4,845,534 | 7/1989 | Fukuta | 257/473 |
| 4,859,616 | 8/1989 | Losehand et al. | 257/473 |
| 4,990,993 | 2/1991 | Tsurumaru | 257/643 |
| 5,003,375 | 3/1991 | Ichikawa | 257/755 |
| 5,087,950 | 2/1992 | Katano | 257/472 |
| 5,284,801 | 2/1994 | Page et al. | 438/623 |
| 5,406,098 | 4/1995 | Hyuga et al. | 257/280 |
| 5,430,329 | 7/1995 | Harada et al. | 257/643 |
| 5,550,065 | 8/1996 | Hashemi et al. | 257/283 |
| 5,585,655 | 12/1996 | Ota et al. | 257/283 |

FOREIGN PATENT DOCUMENTS

| | | | |
|---|---|---|---|
| 0283839 | 11/1989 | Japan | 257/642 |
| 0030131 | 1/1990 | Japan | 257/643 |

OTHER PUBLICATIONS

JSAP Catalog No: AP902232; Dated Nov. 13, 1990; pp. 30–35 with attached translation of the second paragraph.
Patent Abstracts of Japan, vol. 017, No. 556, Oct. 6, 1993.
Patent Abstracts of Japan, vol. 017, No. 640, Nov. 26, 1993.
Patent Abstracts of Japan, vol. 017, No. 415, Apr. 2, 1993.
Patent Abstracts of Japan, vol. 014, No. 009, Jan. 10, 1989.
Patent Abstracts of Japan, vol. 010, No. 141, May 24, 1986.

*Primary Examiner*—Tom Thomas
*Assistant Examiner*—Alexander Oscar Williams
*Attorney, Agent, or Firm*—Armstrong, Westerman, Hattori, McLeland & Naughton

[57] ABSTRACT

A semiconductor device has a metal pattern composed of a material reacting on water and a metal protective film formed between an intrusion path of water and the metal pattern on the surface of a part of the metal pattern. The metal pattern is composed of a refractory metal, a refractory metal compound or aluminum, and the metal protective film is formed of any of gold, platinum, palladium, gold alloy, platinum alloy, palladium alloy and lanthanum hexaboron.

15 Claims, 19 Drawing Sheets

SEMICONDUCTOR DEVICE WITH METALLIC PROTECTIVE FILM

This application is a continuation of application Ser. No. 08/515,938 filed Aug. 16, 1995, now abandoned.

BACKGROUND OF THE INVENTION

1. Field of the Invention

The present invention relates to a semiconductor device and a method of manufacturing the same, and more particularly to a semiconductor device having a metal pattern such as wirings, electrodes and pads composed of a metal material of high corrosivity with water and a method of manufacturing the same.

2. Description of the Prior Art

In a semiconductor device, various patterns composed of metals such as electrodes, wirings and bonding pads are formed. Since some of the materials forming metal patterns are liable to corrode with water or gas, a structure of covering the surface of the metal pattern in the semiconductor device with an insulating film is adopted in general.

For example, GaAsMESFET which is covered with the silicon nitride film is described in JSAP Catalog Number:AP902232 Nov. 13, 1990 pp. 30–35.

However, the method to prevent corrosion reaction of a metal pattern is not enough for only one, and it is desired to prevent the intrusion path of water into the semiconductor device certainly, or to prevent the corrosion reaction of a metal pattern by the water that has intruded into the semiconductor device.

SUMMARY OF THE INVENTION

It is an object of the present invention to provide a semiconductor device that restrains intrusion of water and also prevents corrosion reaction of a metal pattern by the water that has intruded and a method of manufacturing the same.

According to the present invention, when a metal pattern where corrosion reaction is liable to occur exists in an intrusion path of water, a metal protective film composed of a material showing ionization tendency smaller than that of the metal pattern is formed on the face on the water intruding side of the metal pattern. In a semiconductor device, water is liable to intrude through between two films of poor adhesion. As two films of poor adhesion, for example, there are an insulating film applied with tensile stress and an insulating film applied with compressive stress, or an insulating film and a metal film, or an insulating film and a compound semiconductor film.

Since generation of corrosion of a metal pattern is checked by adopting such a structure, a leakage current becomes no longer to pass between the metal pattern and the other conductive pattern through a metal hydrate. Moreover, since the supply of water intruding through an insulating film to the metal pattern is prevented by a metal protective film, corrosion reaction is not produced by the water transmitting through the insulating film covering the metal pattern.

As the material of the metal protective film, any of gold, platinum, palladium, gold alloy, platinum alloy, palladium alloy or lanthanum hexaboron ($LaB_6$) is selected. Further, as the material of the metal pattern where corrosion is liable to be produced, there are a refractory metal such as tungsten, molybdenum, titanium and tantalum, a refractory metal compound or aluminum. In particular, tungsten and molybdenum are liable to react on water as compared with other refractory metals.

For example, in a field effect transistor, corrosion reaction of a gate electrode is restrained by covering the at least side portion of the gate electrode made of a refractory metal existing between the lower silicon dioxide film and the upper silicon nitride film, thus deterring generation of a leakage current between the gate electrode and the drain electrode (or the source electrode). When the gate electrode forms Schottky junction with a semiconductor layer, the material for forming the gate electrode is limited. Thus, the above is effective when the material in which the corrosion reaction is hard to be generated cannot be selected. The gate electrode may have the section either in a T-shape or in a rectangular shape.

Since it is unavoidable, in a field effect transistor, to arrange the source electrode and the drain electrode close to the gate electrode in accordance with the request for micronization, it is required to surely prevent corrosion reaction of the gate electrode. Accordingly, it is particularly effective to cover the side portion of the gate electrode opposing to the source electrode and the drain electrode with the metal protective film described above for preventing elapsed deterioration of transistor characteristics.

Further, in a gate pad having the same layer structure as the gate electrode, it is also effective for preventing corrosion reaction to form the above-mentioned metal protective film on the side portion of the gate pad.

It happens sometimes that a material having high adhesion with a metal pattern cannot be selected as the material of the metal protective film. In this case, a layer composed of a material for improving adhesion is made to lie between the metal pattern and the metal protective film, thereby to prevent peeling of the metal protective film.

In case a metal pattern composed of a material liable to react on water is brought into contact with a semiconductor layer or a conductive layer through an opening portion of a first insulating film, when a plane configuration of the metal pattern is made almost the same as the plane configuration of the opening portion, water intruding through between a second insulating film covering the metal pattern and the first insulating film also intrudes between the first insulating film and the metal pattern. When such a structure is adopted, it is required to form the metal protective film for preventing corrosion not only on the metal pattern, but so as to cover the boundary between the metal pattern and the first insulating film. With this, corrosion of the metal pattern with water is prevented, and generation of a leakage current from the metal pattern is prevented.

By adopting such a structure in the gate electrode and wirings, electrode corrosion thereof is prevented.

Intrusion of water is apt to occur through between a bonding pad and an insulating protective film covering the periphery thereof.

Then, when the periphery of a bonding pad is covered with an inorganic insulating protective film and the boundary between the pad and the insulating protective film is covered further with an organic film, it becomes difficult for water to intrude through between the pad and the insulating protective film. This is because of a reason that adhesion between the organic film and the metal is strong.

Further, in order to prevent intrusion of water from the bonding pad, a method of forming the configuration of an opening portion formed in the insulating protective film for exposing the pad center in a polygon, and all of inner angles of the polygon are made larger than 90 degrees is effective.

When a metal protective film is formed on the side portion of the metal pattern, a method of etching a metal protective film, after covering the top and the periphery of the metal pattern with the metal protective film, in a fixed direction so as to have the film remain selectively on the side portion only.

Further, as a method of burying a metal pattern only in the opening portion of the insulating film, there is a method of forming a metal film forming a metal pattern on an opening portion of an insulating film and the insulating film, applying resist thereafter on the metal film, and then etching back the resist and the metal film continuously. With this, the metal film (metal pattern) in the opening portion is flattened. It is sufficient to form a metal protective film thereafter at the end of the boundary between the metal pattern and the insulating film and the circumference thereof.

When a structure that a plurality of metal electrodes or metal wirings having different ionization tendency are in existence in the intrusion path of water is adopted, there is an advantage of utilizing the invention described above, which is conspicuous in particular in a MESFET and a HEMT in which two types of metals are adopted as the electrodes.

DESCRIPTION OF THE PREFERRED EMBODIMENTS

The progress of proceeding to the invention is as follows.

Figure 1A:
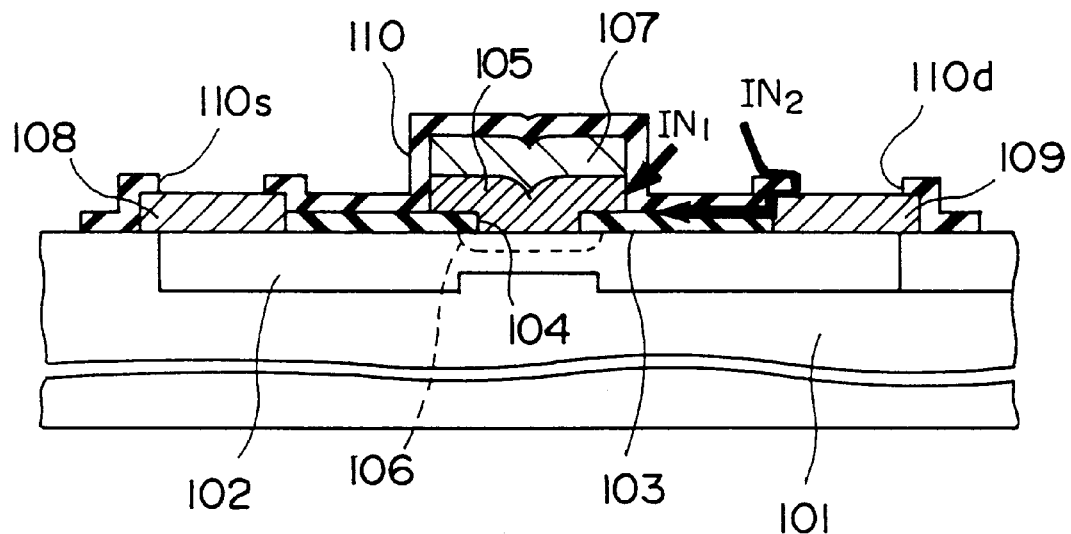
FIG. 1(a) is a sectional view showing a semiconductor device.

As an example thereof, there is a metal semiconductor field effect transistor (MESFET) such as shown in FIG. 1(a).

In FIG. 1(a), there is an operating semiconductor layer 102 composed of GaAs doped with silicon on a semiinsulating gallium arsenide (GaAs) substrate 101, and this operating semiconductor layer 102 is covered with a silicon dioxide film 103 that has been grown at approximately 350° C. by thermal CVD. Further, a gate electrode 105 composed of a tungsten compound is formed on the operating semiconductor layer 102 through an opening portion 104 of the silicon dioxide film 103.

Since a Schottky barrier is formed at a junction portion with the gate electrode 105 in the operating semiconductor layer 102, the area of a depletion layer 106 formed under the gate electrode 105 in the operating semiconductor layer 102 changes in accordance with the magnitude of gate voltage. Besides, a metal wiring 107 is formed on a top face of the tungsten compound forming the gate electrode 105.

Further, a source electrode 108 and a drain electrode 109 are in ohmic contact with the operating semiconductor layer 102 on both sides of the gate electrode 105. The source electrode 108 and the drain electrode 109 are formed of a two-layer structure of gold germanium and gold for instance.

The MESFET having such a structure is covered with a silicon nitride film 110 in order to prevent deterioration due to the reaction between water or gas existing outside and the forming material. The silicon nitride film 110 is formed at a low temperature of approximately 350° C. or less in order to prevent denaturation of the source electrode 108 and the drain electrode 109.

Figure 2:
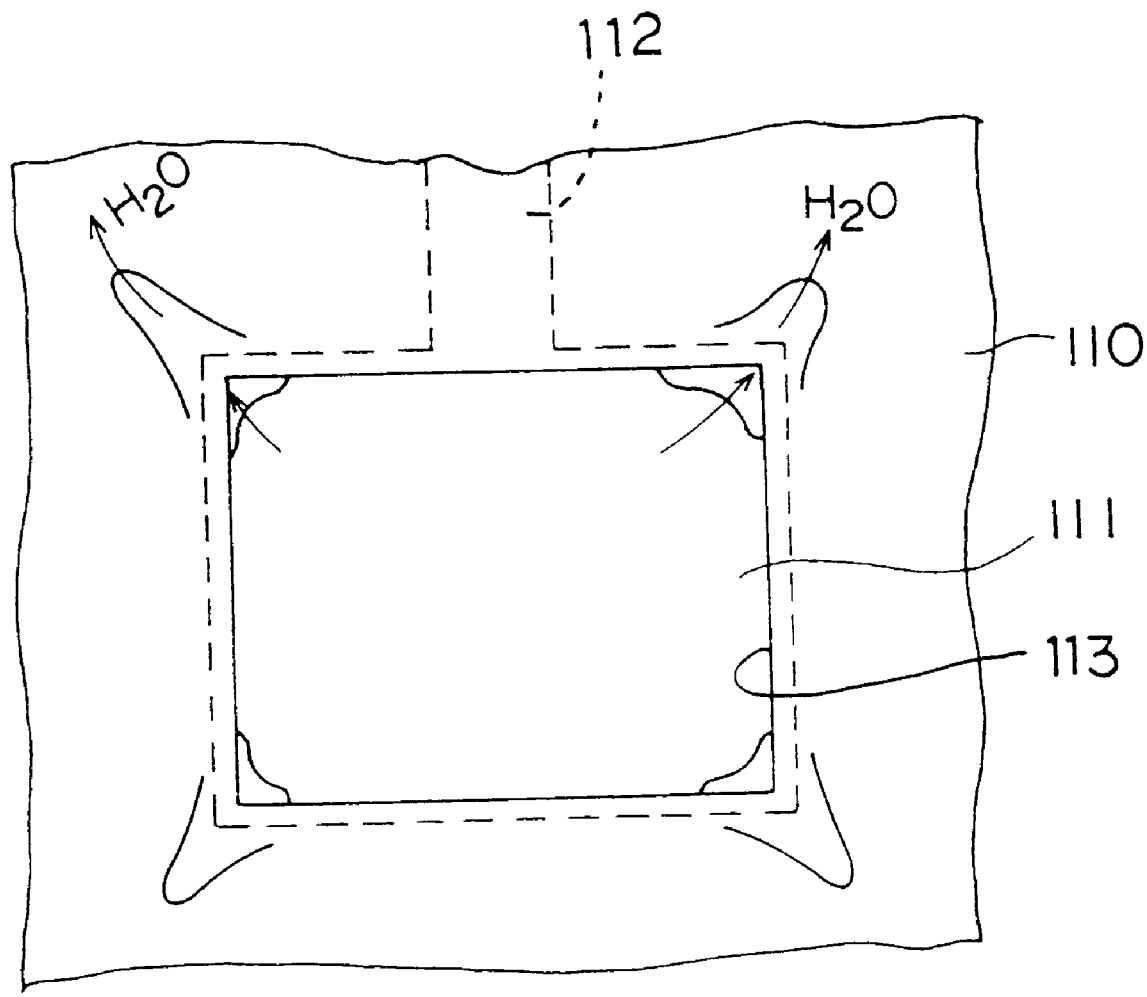
FIG. 2 is a plan view showing a pad and an insulating protective film of a semiconductor device.

Further, the source electrode 108 and the drain electrode 109 are pulled out of the operating semiconductor layer 102 through a wiring 112 and connected to a bonding pad 111 as shown in FIG. 2. The bonding pad 111 is formed of a metal that is hard to react to outside water or gas, e.g., gold. An opening portion 113 in a plane rectangular shape is formed in order to expose the center of the bonding pad 111 for bonding in the silicon nitride film 110 covering the bonding pad 111.

Figure 1B:
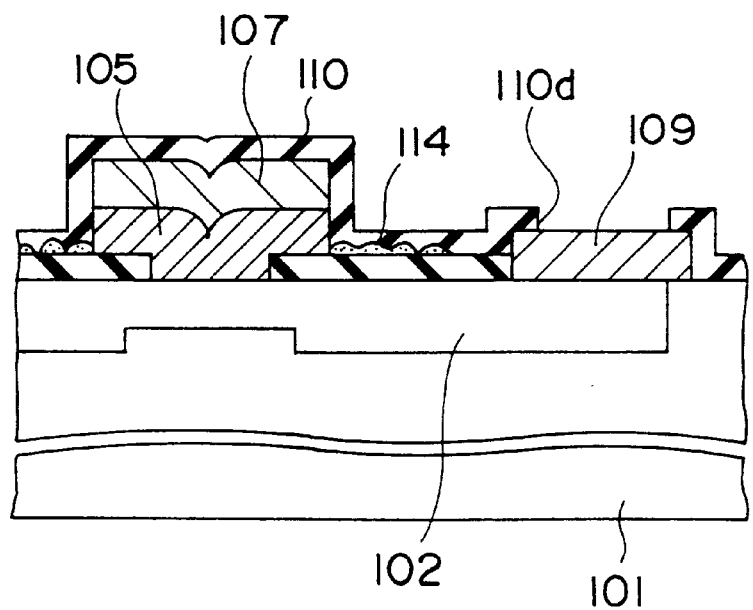
FIG. 1(b) is a partially enlarged sectional view thereof.

Besides, in order to clarify the relative positional relationship between the source electrode 108 or the drain electrode 109 and the opening portion 113, the opening portion 113 is shown above the source electrode 108 or the drain electrode 109 in FIG. 1(a) and FIG. 1(b).

Here, in an FET having the structure shown in FIG. 1(a), the silicon nitride film 110 formed at a low temperature is poor in minuteness, and water is liable to transmit therethrough as shown with a path $IN_1$.

Further, since the silicon nitride film 110 has poor adhesion with a metal film, and moreover, tensile stress has been produced in the silicon nitride film 110, adhesion with the silicon dioxide film 103 having compressive stress is also poor. As a result, as shown with a path $IN_2$, the water that has intruded from the opening portion 113 of the silicon nitride film 110 reaches the gate electrode 105 through between the source/drain electrodes 109, 108 and the silicon nitride film 110 and between the silicon dioxide film 103 and the silicon nitride film 110.

As a preventive measure against intrusion of water, edges of the source electrode 108 and the drain electrode 109 are covered in a rectangular frame shape with the silicon nitride film 110 as shown in FIG. 2. However, water is apt to intrude into the semiconductor device through four corners of the square opening portion 113.

Since a part of the gate electrode 105 and the drain electrode 109 described above is in contact with the operating semiconductor layer 102, a contact potential difference is produced due to the difference in the ionization tendency between these electrodes when those electrodes come into contact with water. With this, a part of tungsten compound forming the gate electrode 105 is ionized with water, and furthermore, tungsten and water react on each other. With this, such a tungsten hydrate 114 as shown in FIG. 1(b) is generated, thus producing corrosion in the gate electrode 105.

Furthermore, when fluorine transmits through the silicon nitride film 110 and is supplied to tungsten, the reaction between the tungsten and water is promoted, thus accelerating generation of the tungsten hydrate 114.

The tungsten hydrate 114 generated as described above spreads up to the source electrode 108 and the drain electrode 109 through between the silicon dioxide film 103 and the silicon nitride film 110, thus causing to generate a leakage current between the gate electrode 105 and the source electrode 108 or between the gate electrode 105 and the drain electrode 109. Further, there is also such a trouble that transistor characteristics are changed by electrode corrosion of the gate electrode 105.

Such metal corrosion is produced by water entering through between two films having poor adhesion, and moreover, metal corrosion is accelerated by the water that transmits through an insulating film and enters into the semiconductor device.

Furthermore, since the wiring that pulls out the gate electrode, the drain electrode or the source electrode to the bonding pad has a layer structure same as that of those electrodes, corrosion is also produced at the side portion of the wiring, thus causing increase in wiring resistance and breaking of wire. Since a gold pattern is formed on the electrode and the wiring in order to lower the resistance, the corroding portion is principally the electrode or the side portion of the wiring.

(The first embodiment)

Figure 3A:
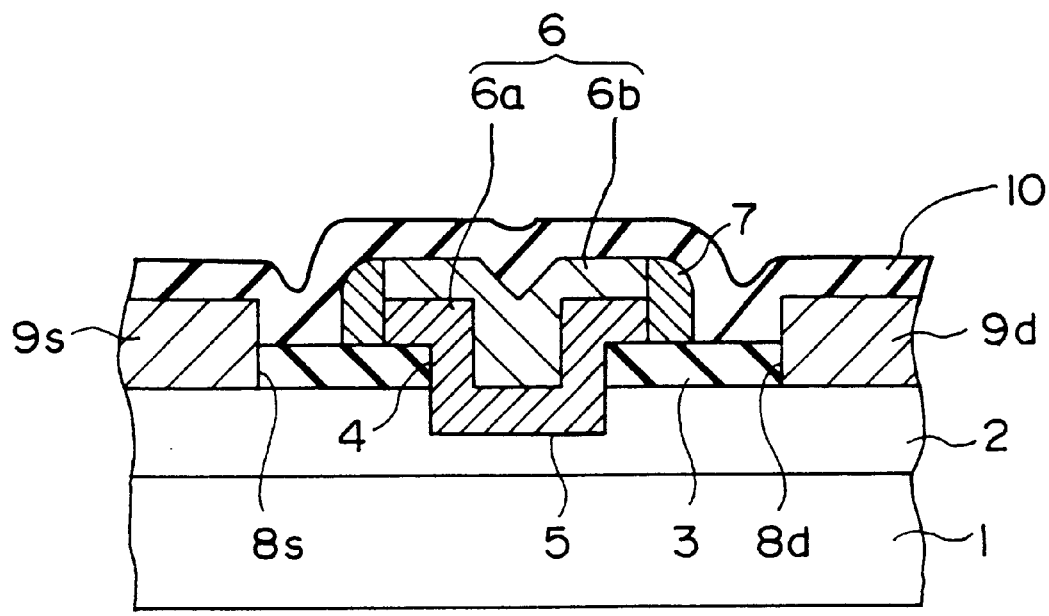
FIG. 3(a) is a sectional view showing a first embodiment of a semiconductor device according to the present invention.

FIG. 3(a) is a sectional view of a MESFET showing a first embodiment of the present invention.

In FIG. 3(a), an n-type GaAs active layer 2 is formed on a semi-insulating GaAs substrate 1, and a silicon dioxide film (an insulating film) 3 is grown by CVD on the GaAs active layer 2. The growth temperature of the silicon dioxide film 3 is approximately 350° C.

An opening portion 4 is formed in the silicon dioxide film 3 located in a gate region, a recessed portion 5 is formed in the GaAs active layer 2 under the opening portion 4, and a gate electrode 6 consisting of tungsten silicide is connected to the GaAs active layer 2 through the opening portion 4 and the recessed portion 5. The gate electrode 6 is composed of a Schottky junction layer 6a connected to the GaAs active layer 2 and a leader wiring layer 6b formed thereon, and the gate electrode 6 protrudes onto the silicon dioxide film 3 and shows a section in a T-shape.

The Schottky junction layer 6a is composed of a refractory metal, a refractory metal compound or aluminum, and the leader wiring layer 6b is formed of a low resistance material such as gold (Au), platinum (Pt), gold alloy and platinum alloy. As the refractory metal, tungsten, molybdenum, titanium, tantalum or the like are available, and as the compound thereof, there are refractory metal silicide, refractory metal nitride, refractory metal aluminum or the like.

On the side wall of the T-shaped gate electrode 6, a metal protective film 7 composed of a metal material that does not react on water or is poor in reaction is formed. As such a metal material, for example, there are gold (Au), platinum (Pt), palladium (Pb), gold alloy, platinum alloy, palladium alloy and lanthanum hexaboron. Here, the reason why a metal film is used for protecting the side portion of the gate electrode 6 is that the adhesion with a metal layer forming the gate electrode 6 is strong.

Further, opening portions 8s and 8d are formed leaving a space on both sides of the gate electrode 6 in the silicon dioxide film 3, and a source electrode 9s and a drain electrode 9d are in ohmic contact with the GaAs active layer 2 through these opening portions 8s and 8d. The source electrode 9s and the drain electrode 9d are formed of a gold-germanium (AuGe) layer and an Au layer formed one after another on the GaAs active layer 2.

Further, the gate electrode 6, the source electrode 9s, the drain electrode 9d and the silicon dioxide film 3 are covered with an insulating protective film 10 composed of silicon nitride grown at a low temperature of 350° C. or less.

Since respective stresses in the insulating protective film 10 and the silicon dioxide film 3 are in reverse directions, adhesion of these films is insufficient. Therefore, the boundary between the insulating protective film 10 and the silicon dioxide film 3 becomes an intrusion path of water. Further, since the adhesion between the metal gate electrode 6 and the insulating protective film 10 is also poor, the boundary thereof becomes an intrusion path of water.

Further, the water through the insulating protective film 10 is supplied to the gate electrode 6.

Since the side face and the upper face of the gate electrode 6 are covered with the metal protective film 7 and the leader wiring layer 6b composed of a material that does not react on water or is poor in reaction on water, however, the intrusion path of water and the leader wiring layer 6b of the gate electrode 6 are not brought into contact with each other. With this, the metal such as the refractory metal, the refractory metal compound or aluminum forming the gate electrode 6 becomes no longer ionized with water, and corrosion reaction due to elusion of ions is deterred. Moreover, the corrosion reaction is never promoted by the gas transmitting the insulating protective film 10.

Furthermore, the adhesion between the metal protective film 7 and silicon dioxide film 3 is more rich than the other adhesion between the metal protective film 7 and a tungsten silicide film.

Accordingly, the hydrate of the refractory metal does not exist between the gate electrode 6 and the source/drain electrodes 9s, 9d, and no leakage current is produced therebetween. With this, the reliability of the element is improved remarkably.

Figure 3B:
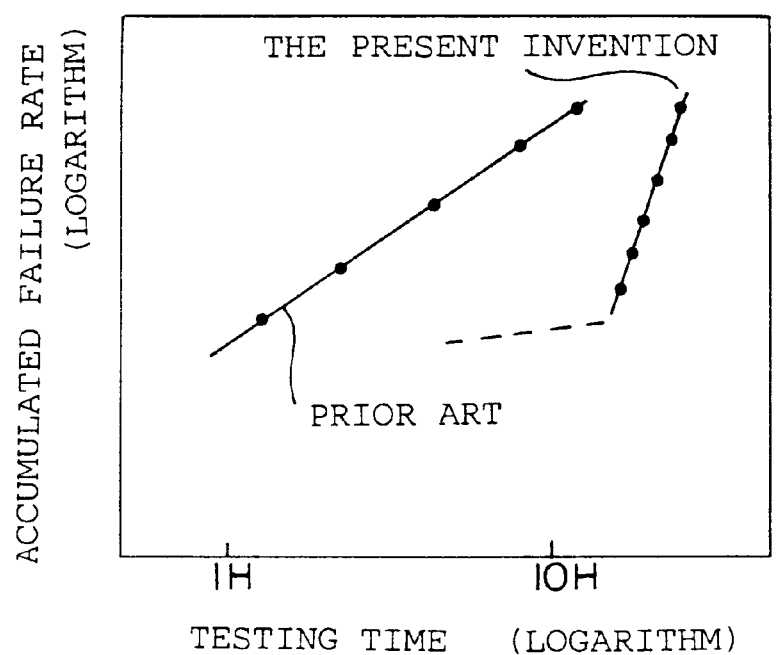
FIG. 3(b) shows a failure rate curve obtained by a reliability test of the semiconductor device of the first embodiment.
Figure 17:
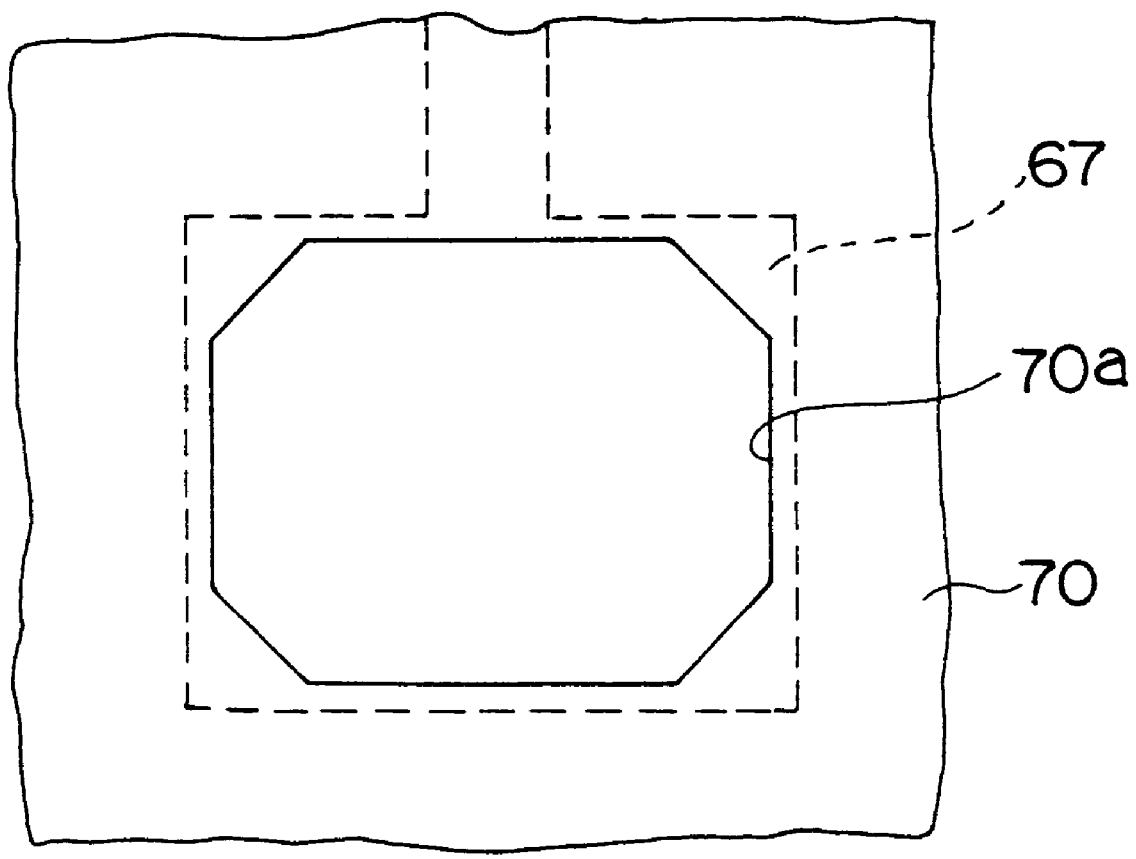
FIG. 17 is a plan view showing a modification example of an insulating protective film of a pad used in a semiconductor device according to a 12th embodiment.

FIG. 3(b) shows failure rate curves obtained through a reliability test of a MESFET having a structure shown in FIG. 1(a) and through a reliability test of a MESFET having a structure shown in FIG. 17. In the reliability test, an element having a gate electrode composed of tungsten silicide is used, and a silicon doped GaAs layer is used as an active layer. Further, the metal protective film adopted only for an element of the present invention is formed of gold.

Besides, evaluation of reliability was performed at the bias voltage between gate and source of 6 V, humidity at 100% and temperature at 130° C.

With a conventional element, an initial trouble was generated only within three hours. As against this, generation of the initial trouble was extended to 15 hours or longer. Further, the average trouble time of a conventional element was 5 hours, but the average trouble time has become 20 hours or longer according to an element of the present invention.

(The second embodiment)

A MESFET according to a second embodiment of the present invention will be described along a manufacturing process.

Figure 4A:
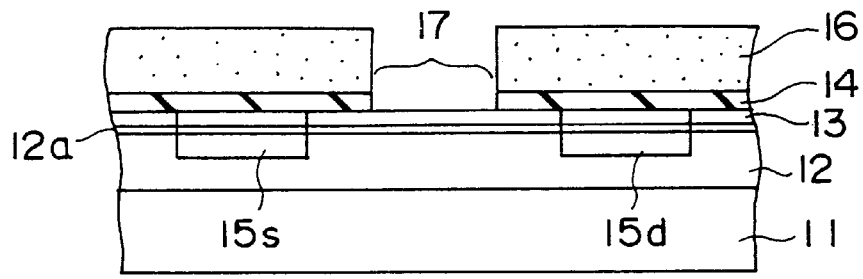
FIG. 4(a) to FIG. 4(h) are sectional views showing a manufacturing process of a semiconductor device according to a second embodiment of the present invention.

First, as shown in FIG. 4(a), silicon-doped GaAs is grown epitaxially on a semi-insulating GaAs substrate 11, thereby to form an n-type GaAs active layer 12. Further, an AlGaAs intermediate layer 12a and a GaAs cap layer 13 are formed one after another on the GaAs active layer 12. Furthermore, silicon is introduced into the cap layer 13 and the GaAs active layer 12 of the source region and the drain region, respectively, thereby to form contact layers 15s and 15d. Then, silicon nitride (SiN) and silicon oxide ($SiO_2$) are grown continuously by 500 Å and 3,000 Å, respectively on the cap layer 13, thereby to form an insulating film 14. Thereafter, patterning is applied to the insulating film 14 by photolithography using a resist pattern 16, thereby to form an opening portion 17 in the gate region.

Figure 4B:
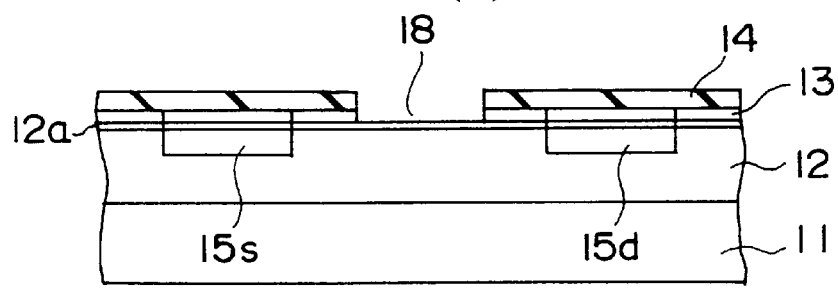

Next, GaAs forming the cap layer 13 is removed by reactive ion etching (RIE) with the resist pattern 16 as a mask. With this, a recessed portion 18 as shown in FIG. 4(b) is formed on the intermediate layer 12a.

When RIE is performed, mixed gas containing sulfur hexafluoride ($SF_6$) and silicon tetrachloride ($SiCl_4$) is used as the etching gas, and the etching rate is set to 2,000 Å/min by adjusting applied power energy and pressure reduction quantity. With this, since a selection ratio of etching of GaAs to AlGaAs is 100 or more, the AlGaAs intermediate layer 12a functions as an etching stop layer.

Figure 4C:
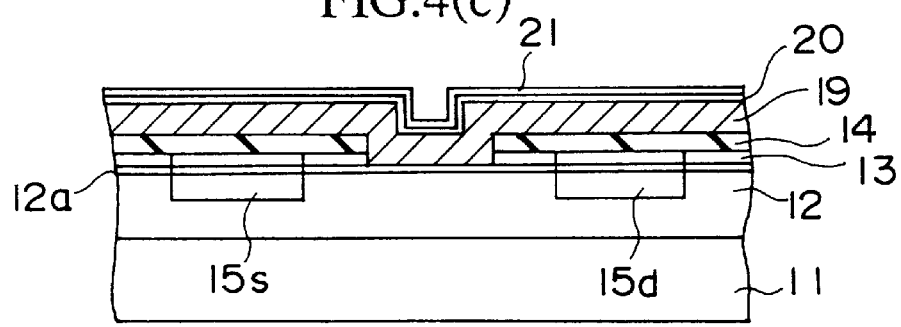

Next, as shown in FIG. 4(c), after the resist pattern 16 is peeled off, a tungsten silicide (WSi) layer (Schottky junction layer) 19 in a thickness of 1,500 Å, a titanium (Ti) layer 20 in 50 Å and an Au layer 21 in 1,000 Å are formed continuously by sputtering on the surfaces of the insulating film 14, the cap layer 13 and the intermediate layer 12a. The WSi layer 19 forms a Schottky barrier in the vicinity of the boundary with the AlGaAs intermediate layer 12a. Further, the Au layer 21 is formed for lowering the resistance of the gate electrode. The Ti layer 20 is formed to strengthen the adhesion between the Au layer 21 and the WSi layer 19.

Figure 4D:
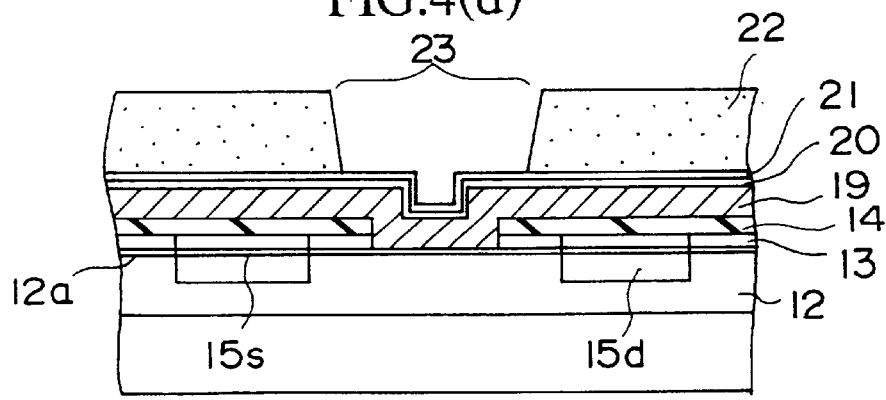

Thereafter, positive type photoresist 22 is applied thick, light is radiated to the gate region by exposure, and then, the photoresist 22 is developed. With this, as shown in FIG. 4(d), a window 23 for exposing the inside of the opening portion 17 of the insulating film 14 and the Au layer 21 therearound is formed in the photoresist 22. The window 23 has a section in a reverse trapezoidal shape by adjusting exposure.

Figure 4E:
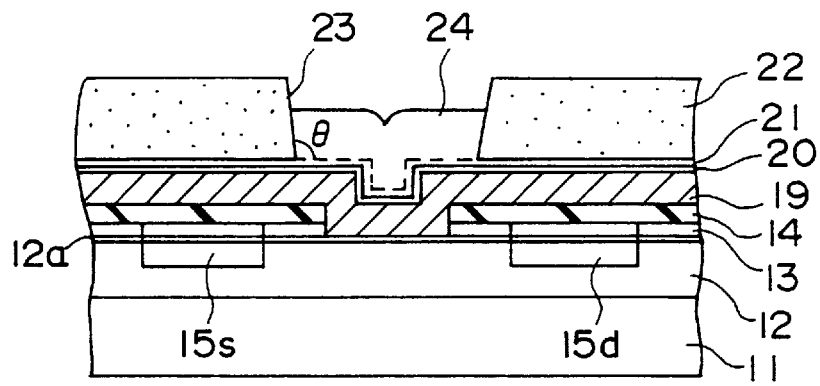

Then, electrolytic plating with gold is applied onto the Au layer 21 in the window 23 in the photoresist 22 using the Au layer 21, the Ti layer 20 or the like as plating electrodes. With this, as shown in FIG. 4(e), an overgate layer 24 composed of gold is formed in the window 23 of the photoresist 22. Inclination θ of a side wall of the overgate layer 24 is larger than 90°.

Figure 4F:
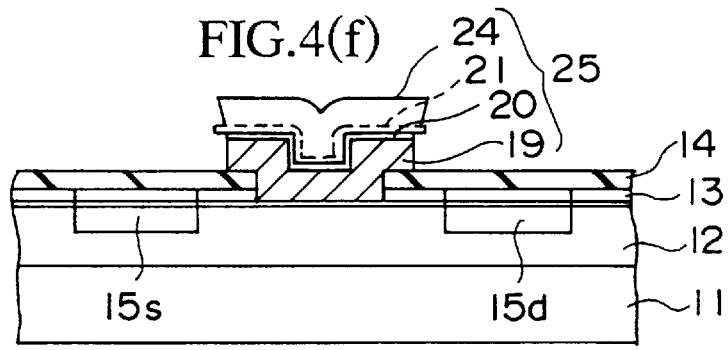

Next, after the photoresist is peeled off with a solvent, as shown in FIG. 4(f), the Au layer 21, the Ti layer 20 and the WSi layer 19 under the overgate layer 24 are etched with the layer 24 as the mask. A gate electrode 25 is formed by the overgate layer 24 and the Au layer 21, the Ti layer 20 and the WSi layer 19 thereunder. The WSi layer 19 in the gate electrode 25 comes into Schottky contact with the AlGaAs intermediate layer 12a and becomes a Schottky electrode.

As a method of etching the Au layer 21 and the Ti layer 20, magnetron sputter etching is employed. When argon gas is used as the etching gas in this case, etching atmospheric pressure is set to 5 mTorr, and radio frequency power is set to 1 KW, the etching rate of 1,000 Å/min has been obtained. Further, RIE is applied as the etching method of the WSi layer 19, and $SF_6$ gas is used as the etching gas, thus obtaining the etching rate of 1,200 Å/min.

Figure 4G:
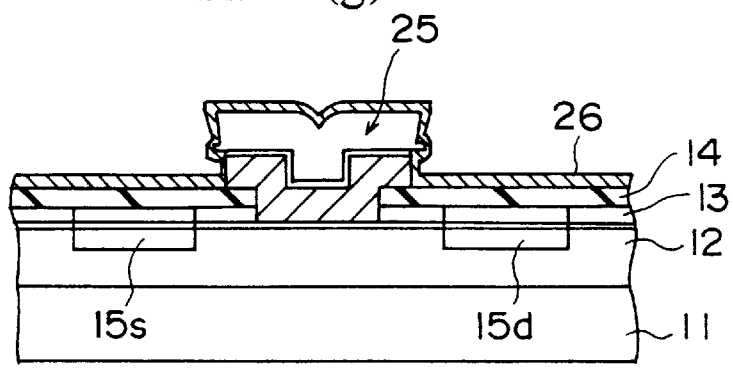

Next, as shown in FIG. 4(g), a moisture resistant metal protective film 26 composed of Au is formed on the top face and the side face of the gate electrode 25 and the top face of the insulating film 14 by sputtering. This metal protective film 26 is formed so that the film thickness reaches 2,000 Å on the insulating film 14, but the film is formed thinner on the side portion of the gate electrode 25 as compared with other regions.

Figure 4H:
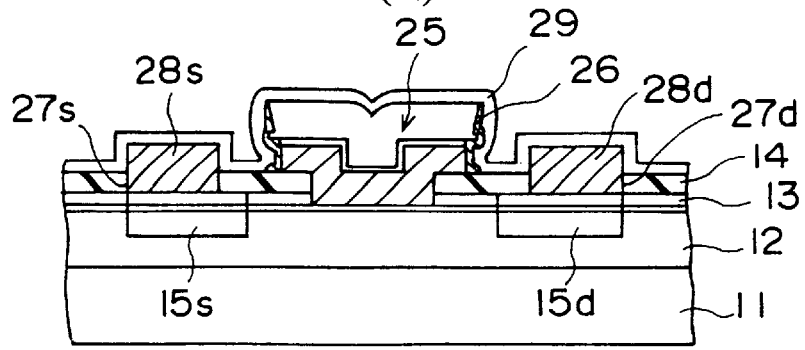

Then, as shown in FIG. 4(h), the metal protective film 26 is etched anisotropically in a perpendicular direction so as to leave it only on the side wall of the gate electrode 25 in a reverse trapezoidal shape. In this case, magnetron sputter etching is used, Ar is introduced into the etching ambient atmosphere as the etching gas, the pressure of the etching ambient atmosphere is reduced to 5 mTorr, and the radio frequency electric energy is set to 1 KW. With this, the etching rate of 1,000 Å/min has been obtained.

Thereafter, opening portions 27s and 27d are formed in the insulating film 14 on the contact layers 15s and 15d, and a source electrode 28s and a drain electrode 28d are formed on the contact layers 15s and 15d through these opening portions 27s and 27d. The source electrode 28s and the drain electrode 28d are formed by lift-off.

Finally, silicon nitride is grown in a thickness of 1,000 Å by CVD as an insulating surface protective film 29, and the MESFET is covered with this surface protective film 29. The growth temperature of silicon nitride is set to approximately 300° C.

Besides, wirings are led out of the gate electrode, the source electrode and the drain electrode, respectively, and connected to the pads separately. These wirings and pads are covered with the surface protective film 29. Further, an opening for exposing the center of the pad is formed in the surface protective film 29. A structure for preventing intrusion of water from the opening will be described later.

Reliability evaluation was made on the MESFET thus completed while setting the bias voltage between gate and source to 6 V, humidity to 100% and temperature to 130° C. As the result of reliability evaluation, it was found that an initial trouble did not occur in 15 hours or less and average hours until the trouble occurs have reached 20 hours or longer.

Besides, the material forming Schottky junction with the AlGaAs intermediate layer 12a is not limited to a WSi layer, but may be a refractory metal compound such as a titanium compound and a molybdenum compound or a refractory metal other than the above. As the refractory metal compound, for example, there are refractory metal silicide, refractory metal nitride and refractory metal aluminum.

Further, as the metal protective film 26 formed on the side face of the gate electrode 25, it is sufficient that the film is relatively superior in moisture resistance to the refractory metal or the refractory metal compound forming the gate electrode 25. As the moisture resistant material, there are platinum, palladium, gold alloy, platinum alloy, palladium alloy, lanthanum hexaboron or the like other than Au.

When the gate electrode is formed of tungsten or tungsten alloy, an effect of making corrosion reaction of the gate electrode harder to be produced can be expected even when the metal protective film 26 is formed of tantalum or titanium having smaller ionization tendency than tungsten.
(The third embodiment)

In the second embodiment, the section of the overgate layer is made in a reverse trapezoidal shape in order to leave the metal protective film on the side wall of the gate electrode, and the side face thereof is inclined so that the upper part becomes wider than the lower part. Even when the section of the overgate layer is formed in a trapezoidal shape, however, it is possible to leave the moisture resistant film only on the side wall of the gate electrode selectively by following the process described hereunder.

First, a state shown in FIG. 4(c) is produced through the same process as the second embodiment. Then, photoresist is applied onto the Au layer 21, exposed by irradiating the gate region with light and then developed. The photoresist 30 is formed by applying a plurality of photoresists having different sensitivities one by one, and the sensitivity is distributed so as to get lower from the bottom toward the top.

Figure 5A:
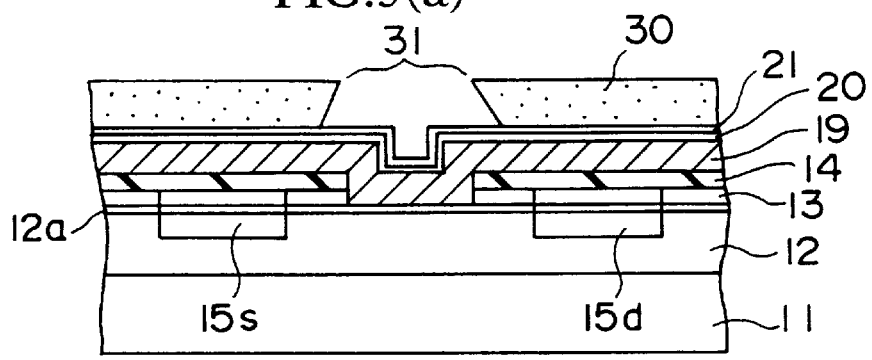
FIG. 5(a) to FIG. 5(d) are sectional views showing a manufacturing process of a semiconductor device according to a third embodiment of the present invention.

With this, as shown in FIG. 5(a), a window 31 is formed above the opening portion 17 of the insulating film 14 in the photoresist 30. The window 31 shows a section in a trapezoidal shape and is wider than the opening portion 17.

Figure 5B:
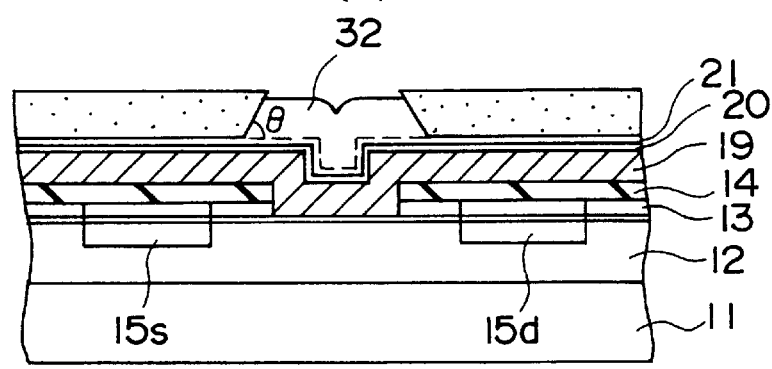

Then, electrolytic plating is applied with gold onto the Au layer 21 in the window 31 of the photoresist 30 using the Au layer 21, the Ti layer 20 or the like as a plating electrode. With this, as shown in FIG. 5(b), an overgate layer 32 composed of gold is formed in a trapezoidal shape in the window 31 of the photoresist 30. The inclination θ of the side wall of the overgate layer 32 is smaller than 90°.

Figure 5C:
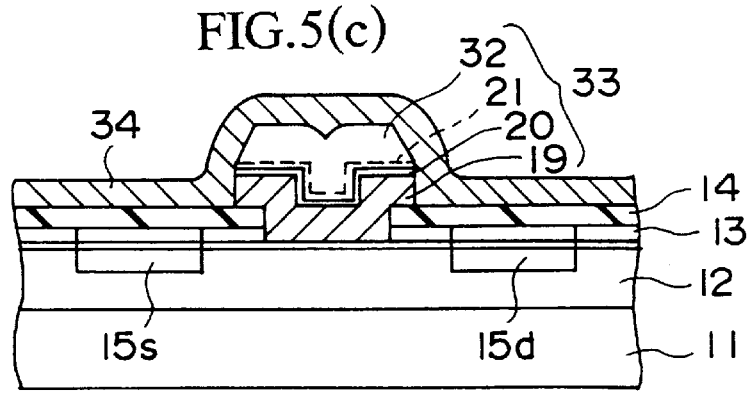

Next, after the photoresist 30 is peeled off with a solvent, using the overgate layer 32 as a mask, the Au layer 21, the Ti layer 20 and the WSi layer 19 thereunder are etched by the same method as the second embodiment. A gate electrode 33 such as shown in FIG. 5(c) is structured with the overgate layer 32 and the Au layer 21, the Ti layer 20 and the WSi layer 19 remaining thereunder. The WSi layer 19 in the gate electrode 33 comes into Schottky contact with the AlGaAs intermediate layer 12a.

Next, a moisture resistant metal protective film 34 composed of Au is formed along the top face and the side face of the gate electrode 33 and the top face of the insulating film 14 by sputtering, thereby to cover the gate electrode 33 completely. This metal protective film 34 is formed so as to show a film thickness of 2,000 Å on the insulating film 14, but is made thicker on the side portion of the gate electrode 33 as compared with other regions.

Then, ions are radiated from an oblique direction while rotating the GaAs substrate 11 thereby to etch the metal protective film 34 by sputtering in the oblique direction, thus leaving the metal protective film 34 only on the side wall of the gate electrode 33 in a trapezoidal shape.

Figure 5D:
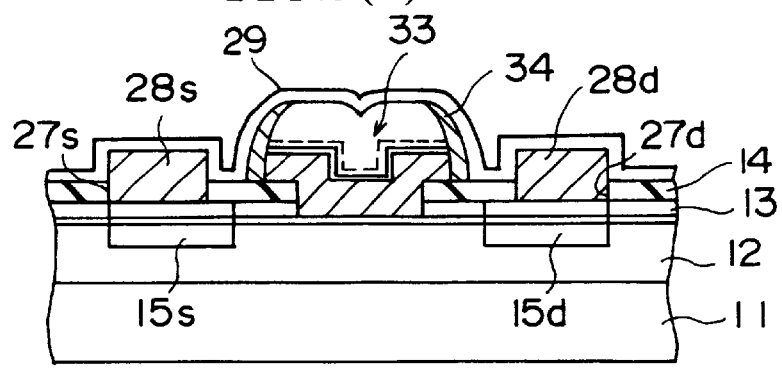

Thereafter, as shown in FIG. 5(d), opening portions 27s and 27d are formed in the insulating film 14 on the contact layers 15s and 15d, and a source electrode 28s and a drain electrode 28d are formed in the contact layers 15s and 15d through these opening portions 27s and 27d. The source electrode 28s and the drain electrode 28d are formed by lift-off.

Finally, a surface protective film 29 composed of silicon nitride is formed at approximately 300° C. similarly to the second embodiment.

By forming the section of the gate electrode 33 in a trapezoidal shape as described above, the metal protective film 34 formed on the side wall is made thicker than in the second embodiment, thus making it possible to improve covering performance of the side wall of the gate electrode 33. As a method of making the section of the gate electrode 33 in a trapezoidal shape, there is a vapor deposition lift-off method or a method of applying sputter etching using a resist mask.
(The fourth embodiment)

In the embodiments described above, a metal protective film is formed directly on the side wall of the gate electrode, but a structure as described hereunder may also be adopted in order to strengthen the adhesion between the metal protective film and the gate electrode.

First, a state shown in FIG. 4(f) of the second embodiment is obtained through the process described already.

Figure 6A:
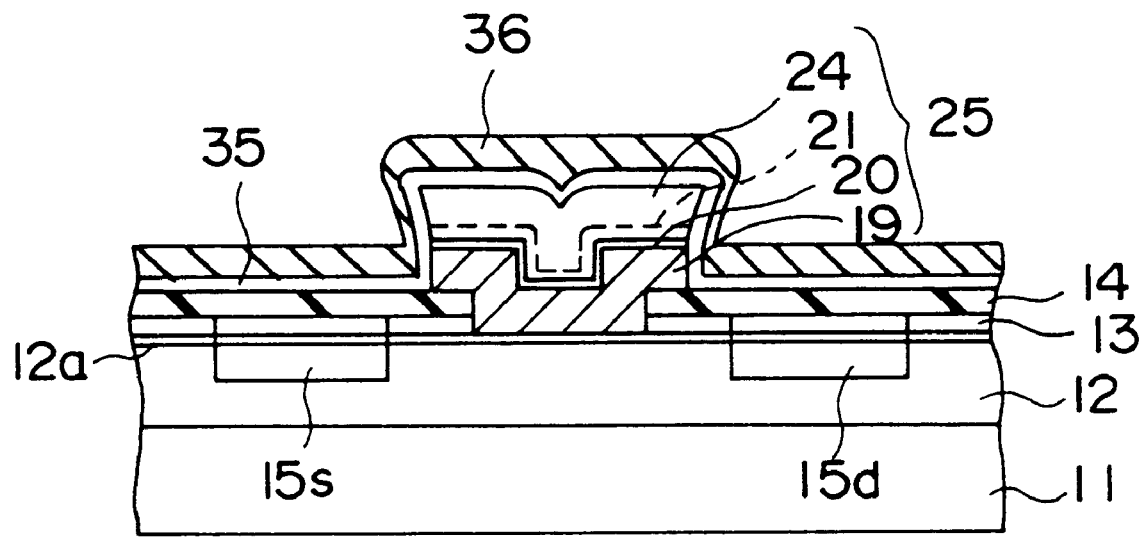
FIG. 6(a) and FIG. 6(b) are sectional views showing a part of a manufacturing process of a semiconductor device according to a fourth embodiment of the present invention.

Next, as shown in FIG. 6(a), an adhesion strengthening film 35 composed of titanium having a film thickness of 50 Å is formed on the top face and the side face of the gate electrode 25 and the top face of the insulating film 14 by sputtering. Then, a moisture resistant metal protective film 36 composed of Au is formed on the adhesion strengthening film 35 in a thickness of 2,000 Å by sputtering.

Figure 6B:
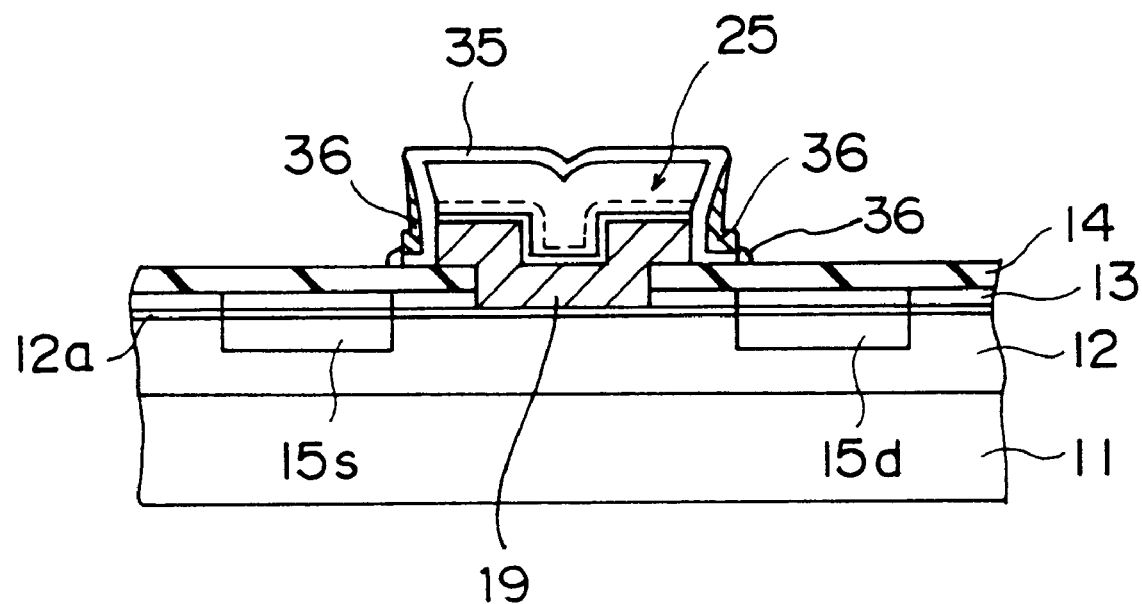

Then, as shown in FIG. 6(b), the metal protective film 36 is etched anisotropically in a perpendicular direction, thereby to leave the film 36 only on the side wall of the gate electrode 25 in a reverse trapezoidal shape. A MESFET is formed thereafter through the same process as the second embodiment. The metal protective film 36 becomes harder to peel off by forming the adhesion strengthening film 35 as described above. In particular, it is specially effective when the range of selection of the material of the gate electrode 25 is narrow.

Further, since the metal etched from the metal protective film 36 adheres to the side wall of the adhesion strengthening film 35, it is avoidable that the side wall of the adhesion strengthening film 35 comes into contact with water.

When the metal protective film is formed of platinum, Ti is also used as the adhesion strengthening film 35.

Such an adhesion strengthening film may also be adopted in the third embodiment.

Besides, the adhesion strengthening film 35 is in existence on the gate electrode 25, and it is located at a position where water is hard to intrude.
(The fifth embodiment)

The present embodiment is an example in which the Schottky junction layer is formed into a two-layer structure in order to lower specific resistance of the gate electrode.

Figure 7:
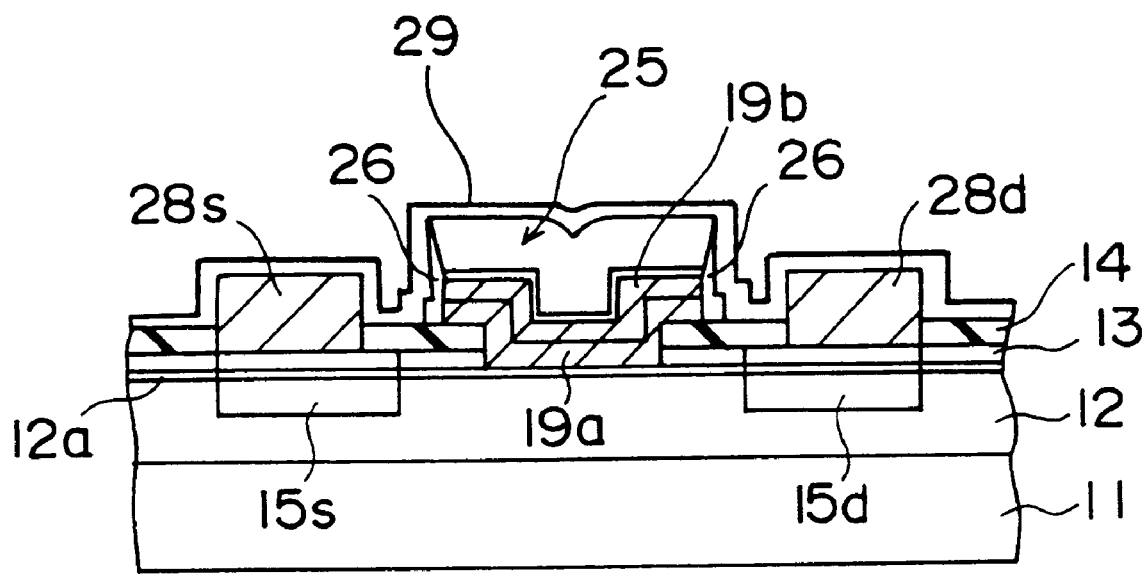
FIG. 7 is a sectional view showing a semiconductor device according to a fifth embodiment of the present invention.

For example, the Schottky junction layer forming the gate electrode is composed of a refractory metal compound layer 19a composed of tungsten silicide coming in contact with an active layer 12 and a refractory metal 19b composed of tungsten as shown in FIG. 7. With this, the resistance of the Schottky junction layer is lowered. Further, this structure is specially effective when it is required to select a material of high resistance as the Schottky junction layer of the gate electrode.

Besides, those reference numerals that are the same as FIG. 4(h) show the same elements in FIG. 7.

Such the two-layer structure may also be adopted in the third embodiment.

(The sixth embodiment)

In the embodiments described above, the side portion of the Schottky junction layer forming the gate electrode is made to protrude onto the insulating film. However, the Schottky junction layer may be made to exist only in the opening portion of the insulating film by going through a process described hereunder.

Figure 8A:
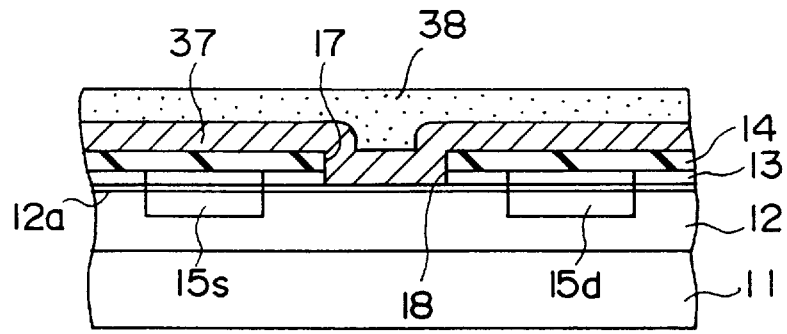
FIG. 8(a) to FIG. 8(e) are sectional views showing a manufacturing process of a semiconductor device according to a sixth embodiment of the present invention.

First, the process up to that shown in FIG. 4(b) is the same as the second embodiment. In such a state, a WSi film 37 that is a Schottky electrode material is formed in a thickness of 1,500 Å by sputtering along over an opening portion 17 of an insulating film 14, a recessed portion 18 of a cap layer 13 and the insulating film 14 as shown in FIG. 8(a). In this WSi film 37, a step is produced at the edge portion of the opening portion 17 of the insulating film 14.

Then, positive type resist 38 is spin-coated on the WSi film 37 under the conditions that a thickness of 2 μm is reached. The top face of the positive type resist 38 is flat.

Figure 8B:
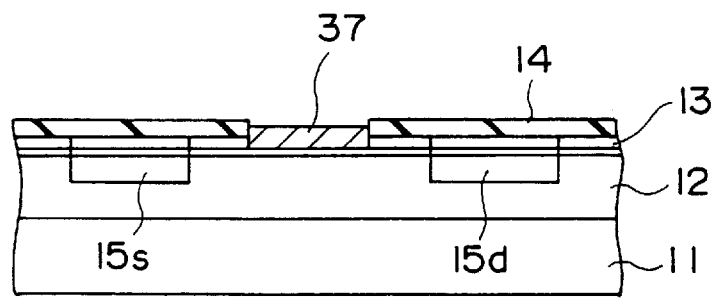

Thereafter, the positive type resist 38 and the WSi film 37 are etched back continuously by ECR plasma etching. $SF_6$ gas is used as the etching gas, and the other etching conditions are set so that the etching rate reaches 2,000 Å. With this, as shown in FIG. 8(b), the WSi film 37 is buried in the opening portion 17 without being made to protrude from the insulating film 14, and this WSi film 37 is used as the gate electrode.

When the WSi film 37 is etched back together with the resist 38 as described above, the WSi film 37 that has remained in the opening portion 17 is flattened, and the intermediate layer 12a is not exposed.

Figure 8C:
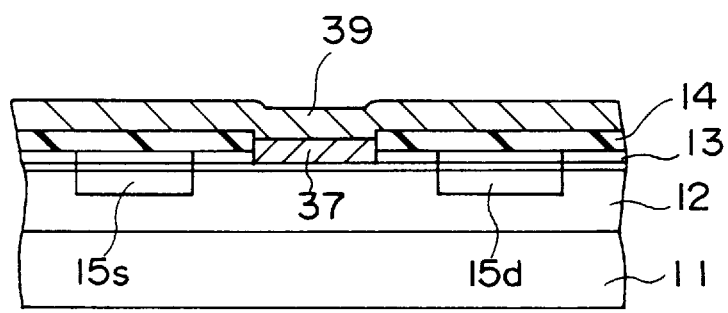
Figure 8D:
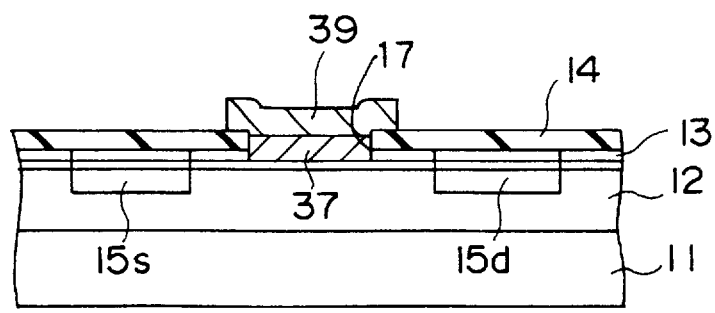

Next, as shown in FIG. 8(c), an Au film 39 is formed in a thickness of 2,000 Å by sputtering on the insulating film 14 and the WSi film 37. Then, as shown in FIG. 8(d), patterning is applied to the Au film 39 using resist (not illustrated) and sputter etching so as to form a configuration of covering the top face of the WSi film 37 and the boundary between the WSi film 37 and the insulating film 14. With this, the Au film 39 is used as the metal protective film. This Au film 39 may be pulled out from above the opening portion 17, thereby to form a pattern of leader wirings (not illustrated) connected to the metal protective film and the bonding pad (not illustrated).

Figure 8E:
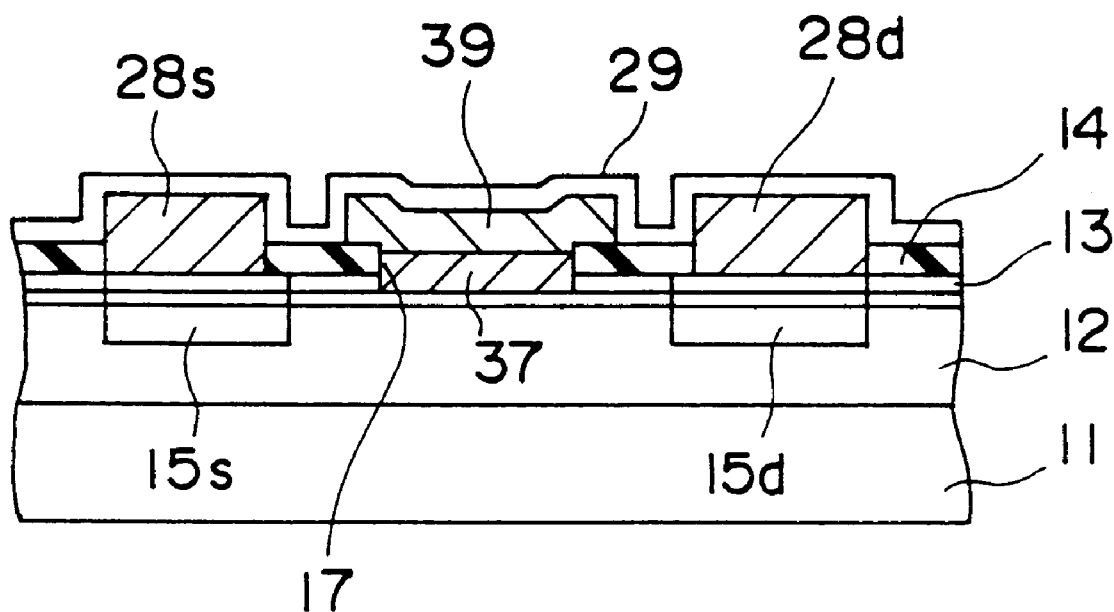

Thereafter, as shown in FIG. 8(e), opening portions are formed in the insulating film 14 on contact layers 15s and 15d, and a source electrode 28s and a drain electrode 28d are formed through these opening portions. Furthermore, a surface protective film 29 composed of silicon nitride is grown at approximately 300° C. so as to cover the whole, and patterning is applied to the surface protective film 29 so as to expose the center of the bonding pad (not illustrated).

In a MESFET formed by the process described above, the Au film 39 covers the top of the WSi film 37 and also covers the boundary between the WSi film 37 and the insulating film 14 therearound from the top. Thus, water becomes no longer to intrude into the boundary from the outside. As a result, the corrosion reaction becomes no longer to be produced in the WSi film 37, and generation of a leakage current due to a hydrate between the WSi film 37 that becomes the gate electrode and the source/drain electrodes 28s and 28d in the vicinity thereof is prevented.

Besides, other refractory metal or refractory metal compound may also be used in place of the WSi film 37. The exemplification thereof is omitted since it has been described in the above-mentioned embodiment. Further, any of platinum, palladium, gold alloy, platinum alloy, palladium alloy and lanthanum hexaboron may be used in place of the Au film 39.

Figure 9A:
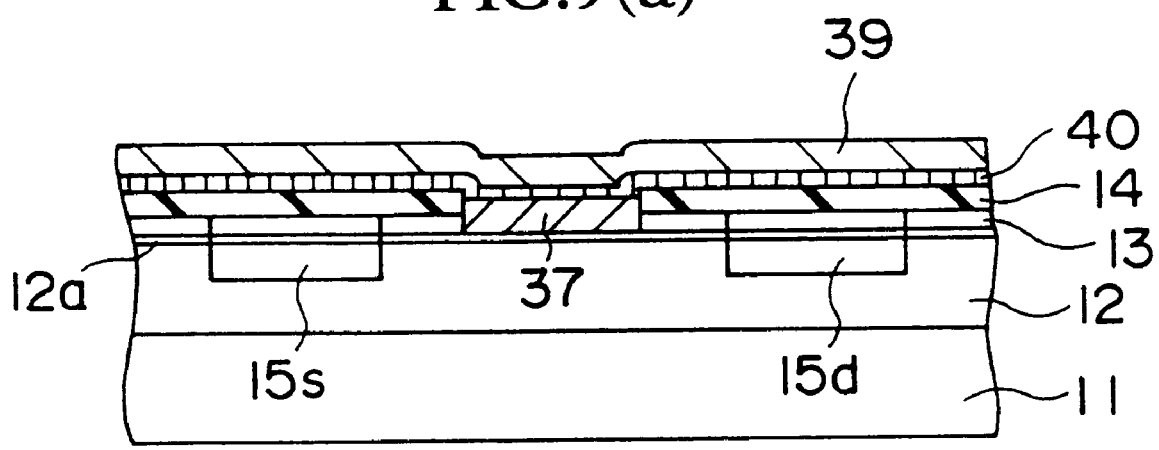
FIG. 9(a) and FIG. 9(b) are sectional views showing a process added further to the manufacturing process of a semiconductor device according to the sixth embodiment of the present invention.

Now, the Au film 39 is formed directly above the WSi film 37 in FIG. 8(c), but a Ti film 40 having a thickness of approximately 50 Å is made to lie between these films as shown in FIG. 9(a) so as to strengthen the adhesion between the WSi film 37 and the Au film 39 by the Ti film 40.

Figure 9B:
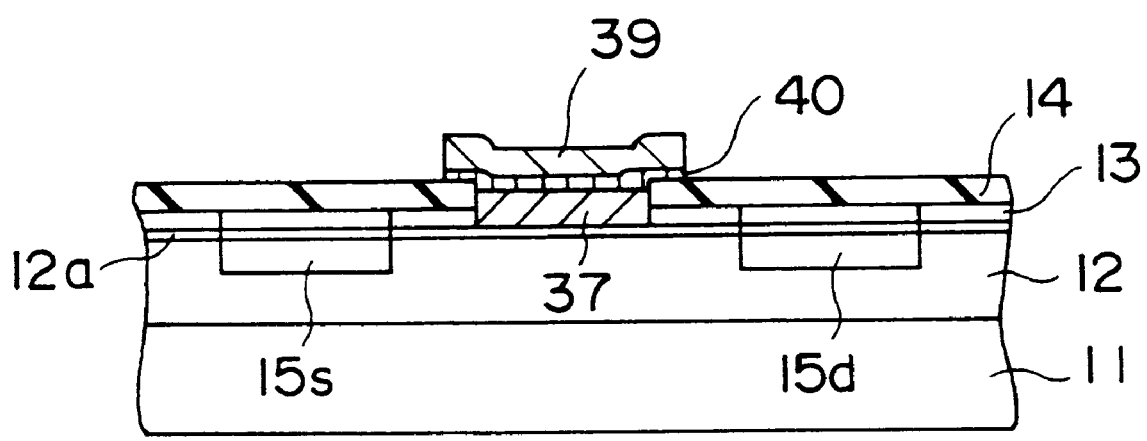

Patterning is applied to the Ti film 40 as shown in FIG. 9(b) using the resist mask used for the patterning of the Au film 39.

(The seventh embodiment)

Figure 10:
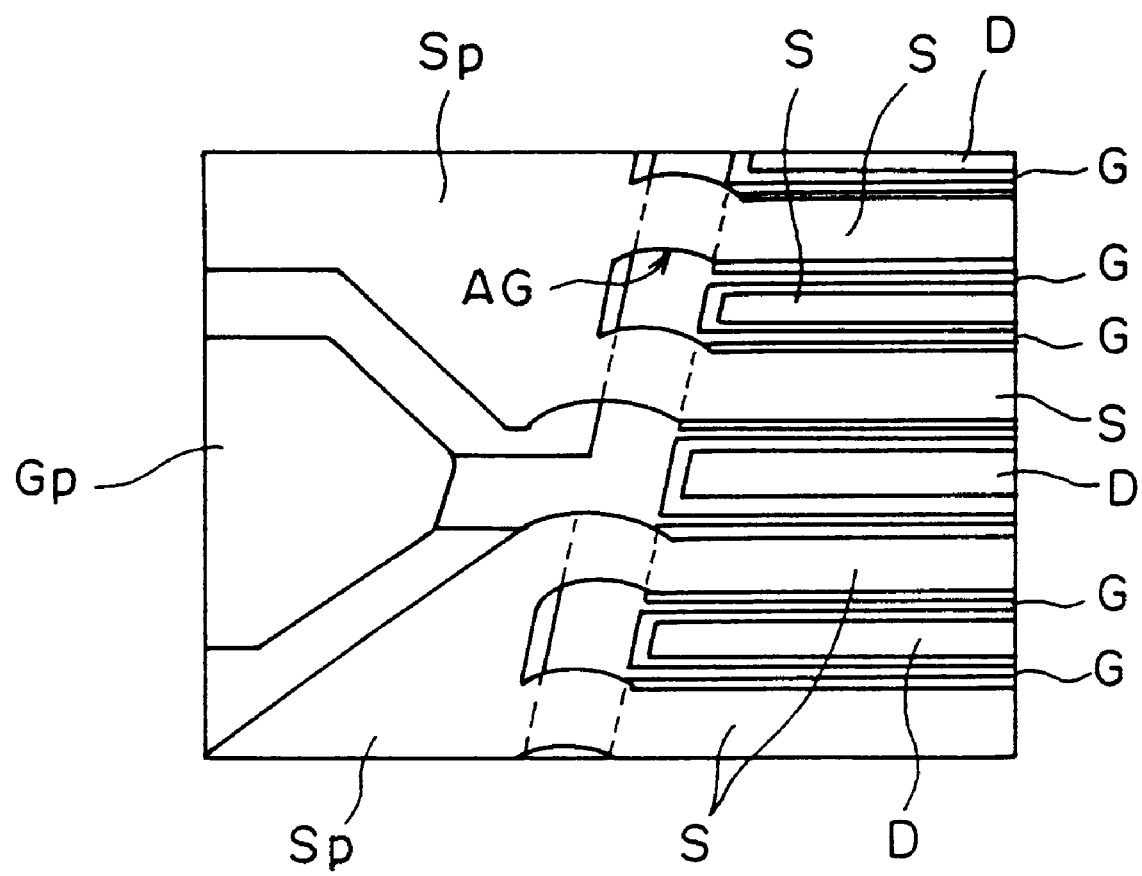
FIG. 10 is a perspective view showing the arrangement of electrodes of a MESFET in which air gaps are adopted.

In a GaAs MESFET in a microwave band, gate fingers G for dividing the gate electrode into a plurality of sections are used and source electrodes S and drain electrodes D are arranged there among as shown in FIG. 10. Further, the source electrodes S are pulled out to source pads SP, and are insulated from gate fingers G by means of air gaps AG in regions where they intersect gate fingers G. Further, the source pads SP are formed in such regions that surround the gate pad GP. Drain pads (not illustrated) are pulled out to the side opposite to the gate pad GP and the source pads SP.

In a GaAs MESFET of such a structure, it is impossible to bury the gate electrode and gate pad in the opening portion of the insulating film at the same time by adopting such etching-back as shown in the sixth embodiment.

For example, when a narrow gate opening portion is formed in the insulating film for forming gate fingers, an opening portion for a wide pad such as a gate pad is formed in the insulating film on the other hand, and a WSi film is grown thereon, hollow states of the WSi film are different between the inside of the pad opening portion and the inside of the gate opening portion. Moreover, the film thickness of the resist formed on a plurality of opening portions having different areas shows a tendency to get thinner in a wide opening portion. Therefore, when the resist and the WSi layer are etched back along the process in the sixth embodiment, there is the possibility that the WSi film disappears inside the pad opening portion because the WSi film gets thinner in the wide opening portion than in the narrower opening portion.

Because of such a fact, it is feared that the Schottky junction with the gate pad becomes no longer to be formed.

Figure 11A:
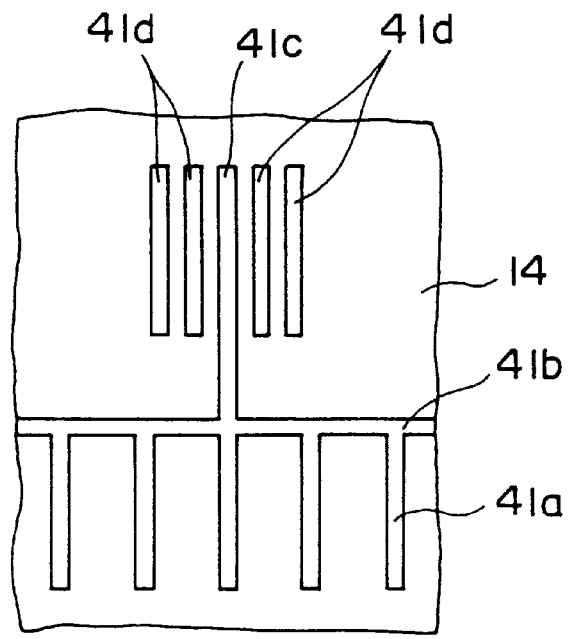
FIG. 11(a) and FIG. 11(b) are plan views showing a process of forming an electrode and a pad of a semiconductor device according to a seventh embodiment of the present invention.

Thus, when the gate electrode, the gate wiring and the gate pad are being formed at the same time, the opening portion formed in the insulating film 14 is formed as shown in FIG. 11(a), as follows.

Namely, opening portions 41a of the insulating film 14 in the region where a plurality of gate electrodes (gate fingers) are formed and a fine stripe shaped opening portion 41b for connecting the ends of these opening portions 41a are formed, and furthermore, a fine opening portion 41c is extended from a part of these opening portions 41a and 41b to a gate pad forming region. Furthermore, a plurality of fine opening portions 41d are formed in parallel with the opening portion 41c at intervals in the gate pad forming area.

According to such a configuration of the openings 41a to 41d, when the WSi film is etched back so as to remain in the opening portion only in accordance with the sixth embodiment, the film thickness of WSi films filled up in the opening portions 41c and 41d in the gate pad forming region and in the opening portion 41a of the gate electrode becomes almost equal to each other. These WSi films form a Schottky junction with the active layer thereunder.

The width of the opening portions 41c and 41d in the gate pad forming region is allowable up to a width in such an extent that the WSi film remains. Further, it is sufficient that at least one of the opening portions 41c and 41d in the gate pad forming region is in existence, and the configuration of these opening portions 41c and 41d needs not to be a rectilinear figure.

Figure 11B:
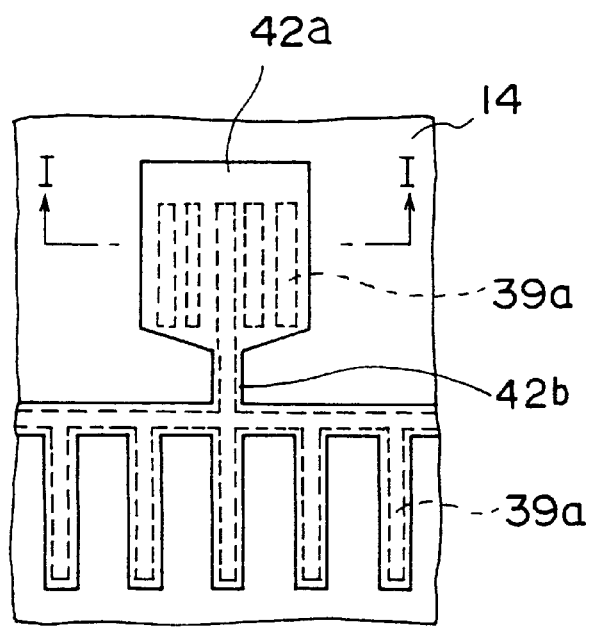
Figure 12:
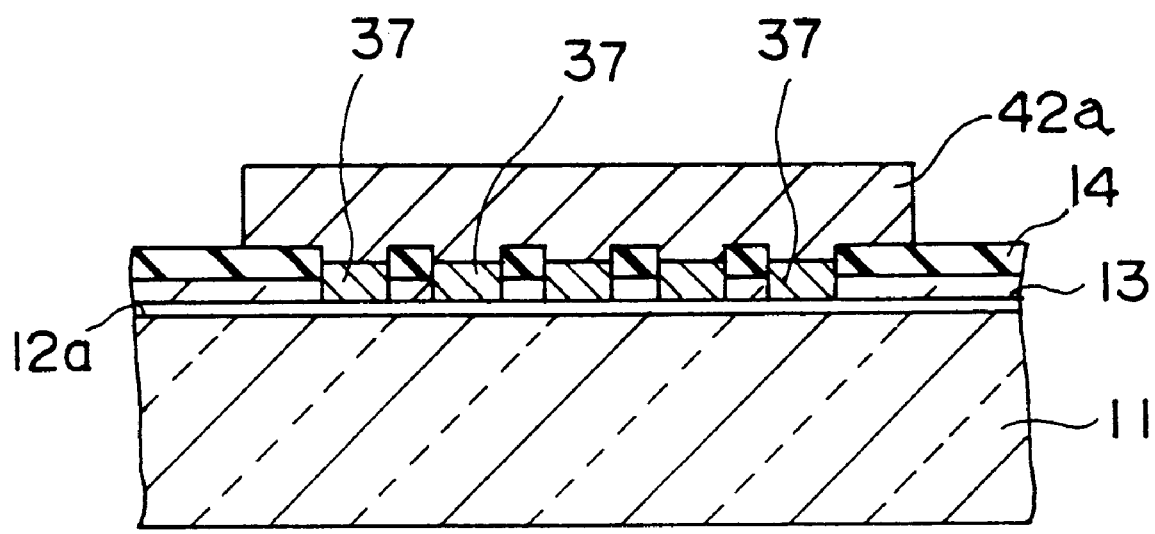
FIG. 12 is a sectional view taken along a line I—I in FIG. 11(b)

Further, after the opening portions 41a to 41d are filled up with the WSi film, the Au film is formed on the opening portions 41a to 41d and the insulating film 14, then patterning is applied to the Au film as shown in FIG. 11(b) so as to cover the opening portions 41a to 41d and the circumference thereof, and a gate pad 42a and a wiring 42b in an extent of covering the opening portions 41c and 41d and the circumference thereof unitedly are formed in the gate pad forming region. The section of the gate pad is shown in FIG. 12. In FIG. 12, those reference numerals that are the same as in FIG. 8(d) show the same elements.

In the refractory metal or the refractory metal compound buried in the opening portions according to such a structure, the corrosion reaction on water is prevented by the metal protective film thereon similarly to the sixth embodiment.

Besides, the function of the gate pad is to lead out an electric current, and element characteristics are not changed by the application of the present technique. Further, since the gate pad 42a is located at a position apart from a channel region between the source electrode and the drain electrode, it does not function as a gate electrode.

(The eighth embodiment)

In the present embodiment, a MESFET having a gate electrode having a square section will be described.

Figure 13:
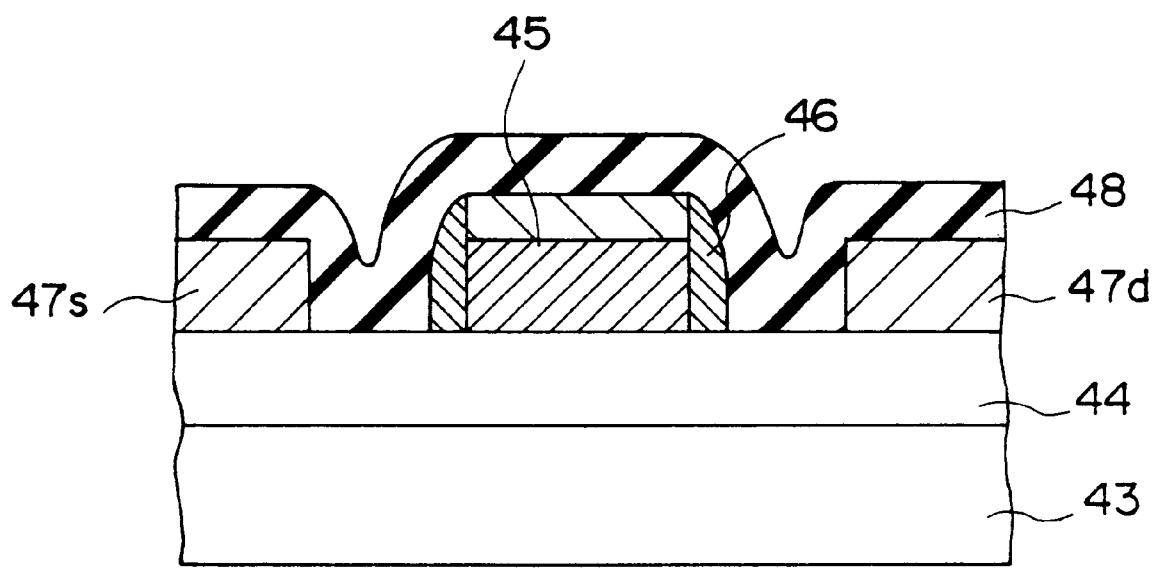
FIG. 13 is a sectional view showing a semiconductor device according to an eighth embodiment of the present invention.

In FIG. 13, an n-type GaAs active layer 44 is formed on a semi-insulating GaAs substrate 43, and a rectangular-shaped gate electrode 45 composed of a two-layer structure of tungsten silicide and gold is formed on the GaAs active layer 44. Further, a metal protective film 46 composed of a material having smaller ionization tendency than tungsten silicide, e.g., titanium is formed on the side portion of the gate electrode 45. Since a Schottky barrier is formed in the GaAs active layer 44 at the junction portion between the gate electrode 45 and the metal protective film 46, the metal protective film 46 functions as a part of the gate electrode 45.

The metal protective film 46 is formed through a process such as described hereunder.

Namely, after the gate electrode 45 is formed, a titanium film (not illustrated) is formed on the whole so as to cover the gate electrode 45 and the active layer 44. Then, anisotropic etching is applied to the titanium film in an almost perpendicular direction so as to leave it only on the side wall of the gate electrode 45, which is used as the metal protective film 46. When anisotropic etching is performed by ECR plasma etching using sulfur hexafluoride ($SF_6$) gas, it is possible to avoid chapping of the surface of the active layer 44.

After the metal protective film 46 is formed, a source electrode 47s and a drain electrode 47d are formed leaving a space therebetween on the sides of the metal protective film 46. Then, the surfaces of the gate electrode 45, the metal protective film 46, the source electrode 47s, the drain electrode 47d and the active layer 44 are covered with a silicon nitride film 48. The silicon nitride film 48 is grown at a low temperature of 300° C. in order to avoid denaturation of the source electrode 47s and the drain electrode 47d.

Now, in a structure in which the metal protective film 46 does not exist on the side portion of the gate electrode 45 having a section in a rectangular shape, the gate electrode 45 composed of tungsten silicide is corroded with water that intrudes through between the active layer 44 and the silicon nitride film 48.

As against the above, in the present embodiment, the metal protective film 46 is formed on the side portion of the gate electrode 45. Therefore, it hardly occurs that water that intrudes through between the active layer 44 and the silicon nitride film 48 reacts on the gate electrode 45. Moreover, the corrosion reaction is not accelerated by the gas transmitting the insulating protective film 10.

Therefore, a hydrate of the refractory metal does not exist between the gate electrode 45 and the source/drain electrodes 47s, 47d, and a leakage current will never be produced therebetween. With this, the reliability of the element is improved remarkably.

(The ninth embodiment)

Figure 14A:
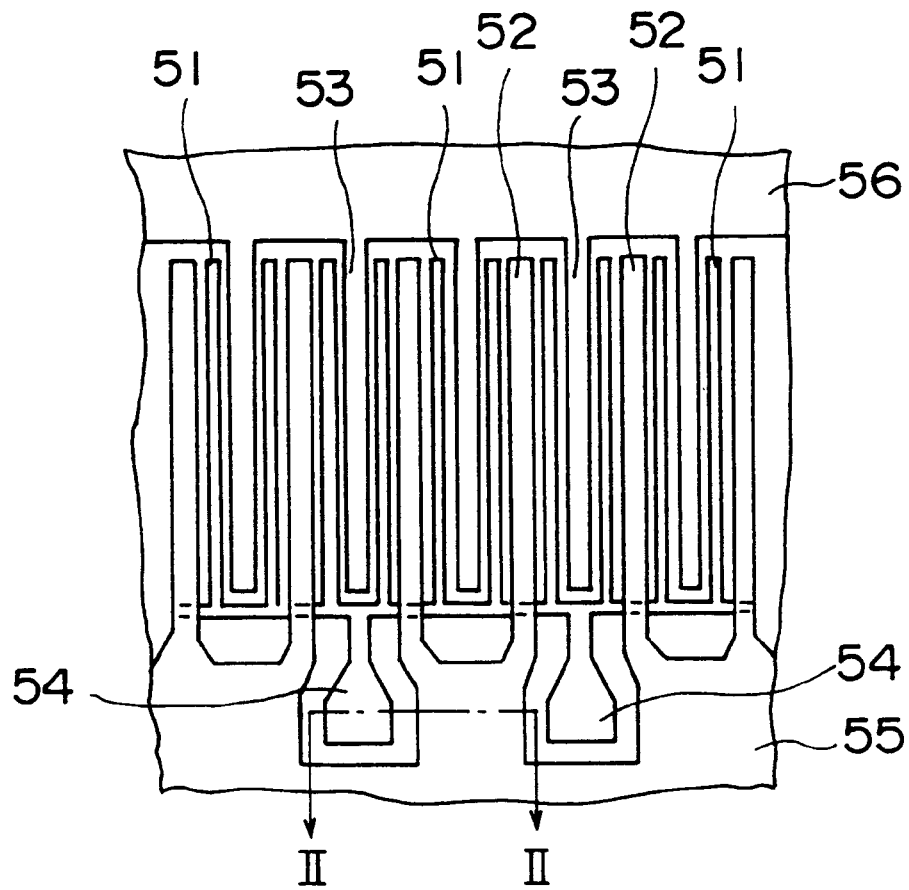
FIG. 14(a) is a plan view showing electrodes and pads of a semiconductor device according to a ninth embodiment of the present invention.

The plane configuration of respective electrodes of the gate, the source and the drain and pads connected thereto in a GaAs MESFET in a microwave band is shown in FIG. 14(a).

Namely, a GaAs MESFET has gate electrodes (gate fingers) 51 that have been divided into a plurality of fingers, source electrodes 52 and drain electrodes 53 arranged alternately among them, gate pads 54 connected to gate electrodes 51, a source pad 55 connected to source electrodes 52, and a drain pad 56 connected to drain electrodes 53. In the region where the source electrodes 52 and the gate electrode 51 intersect each other, air gaps are in existence therebetween.

Figure 14B:
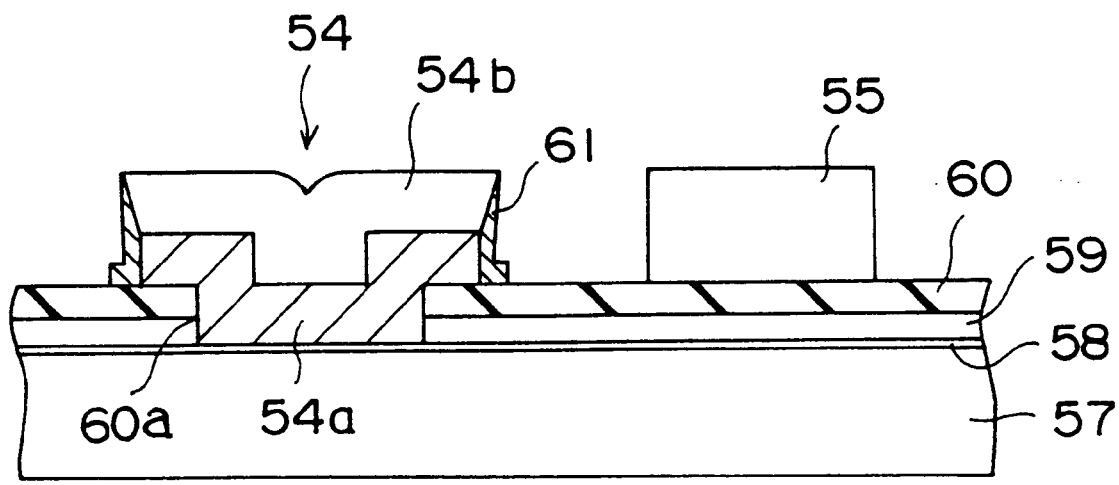
FIG. 14(b) is a sectional view taken along a line II—II thereof.

The gate electrode 51 has the same structure as that in the first embodiment. Further, the gate pad 54 is in Schottky contact with an AlGaAs intermediate layer 58 formed on an n-type GaAs active layer 57 as shown in FIG. 14 (b). The gate pad 54 is formed on the IdGaAs intermediate layer 58 through an opening portion 60a of a GaAs cap layer 59 and an insulating film 60 formed on the AlGaAs intermediate layer 58. Furthermore, the gate pad 54 is composed of a Schottky electrode 54a composed of a refractory metal or a refractory metal compound connected to the AGaAs intermediate layer 58 and a leader wiring layer 54b of gold (Au), platinum (Pt) or the like. Further, on the side wall of the gate pad 54, a metal protective film 61 composed of any of gold, platinum, palladium, gold alloy, platinum alloy, palladium alloy and lanthanum hexaboron is formed. The forming method is executed in accordance with the second or the third embodiment.

Further, the source pad 55 is structured of Au, and is formed on an insulating film 60 around the gate pad 54.

Since the metal protective film 61 composed of a material that is harder to react on water as compared with the refractory metal or the refractory metal compound is formed on the side wall of the gate pad 54, a hydrate becomes difficult to generate from the side wall thereof, and a leakage current between the gate pad 54 and the source pad 55 is deterred. In particular, it is effective in point of the reliability of a semiconductor device to prevent corrosion reaction because the pad is exposed to the outside.

Besides, the reason why the gate pad 54 is divided into a plurality of sections is to apply voltage uniformly to a plurality of gate electrodes.

(The tenth embodiment)

A MESFET of the present embodiment has a structure for making a leakage current hard to pass between the gate pad and the source pad.

Figure 15A:
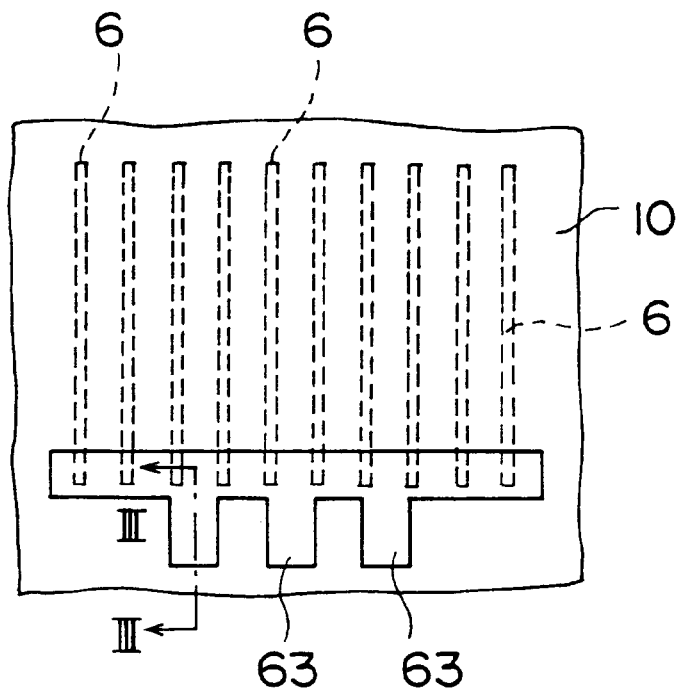
FIG. 15(a) is a plan view showing electrodes and pads of a semiconductor device according to a tenth embodiment of the present invention.
Figure 15B:
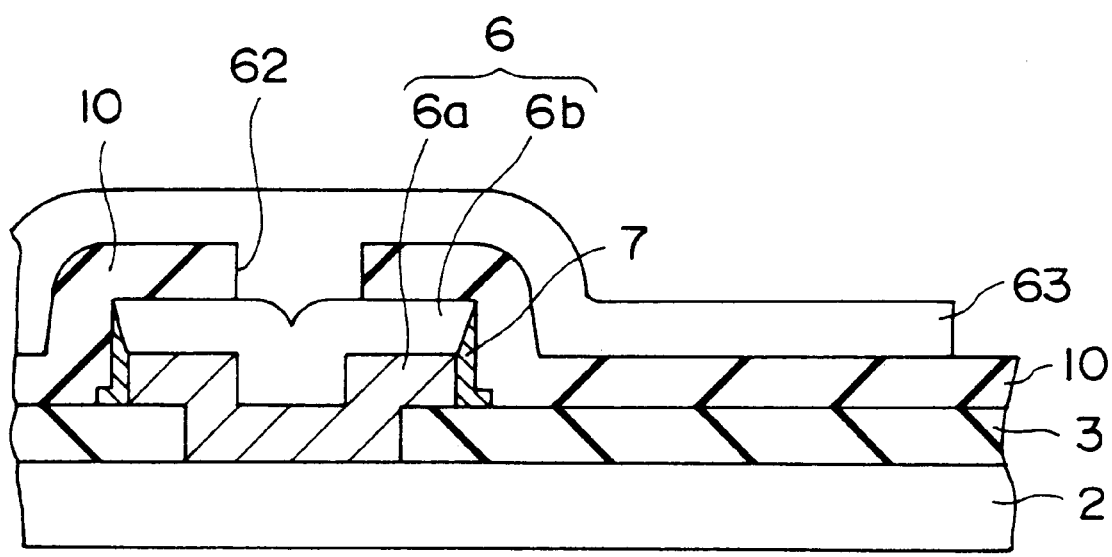
FIG. 15(b) is a sectional view taken along a line III—III thereof.

In a MESFET, a gate electrode is divided into a plurality of pieces as shown in FIG. 15(a). The gate electrode 6 has the same structure as that of the first embodiment as shown in FIG. 15(b). In FIG. 15(b), the reference numerals same as those in FIG. 1 show the same elements. Further, an opening portion 62 is formed on the end portion of the gate electrode 6 in a surface protective film 10 composed of silicon nitride covering the gate electrode 6. Gate pads 63 formed on the surface protective film 10 are connected to the gate electrode 6 through the opening portion 62.

Since the gate pads 63 are formed of a moisture resistant material such as gold, platinum, palladium, gold alloy, platinum alloy and palladium alloy, corrosion reaction is never produced in the gate pads 63. Accordingly, a leakage current due to a hydrate is never produced among the gate pads 63 and the source pads (not illustrated) therearound.

(The 11th embodiment)

The present invention relates to a structure for preventing intrusion of water from pads connected to a source electrode and a drain electrode of a MESFET or a HEMT.

Figure 16A:
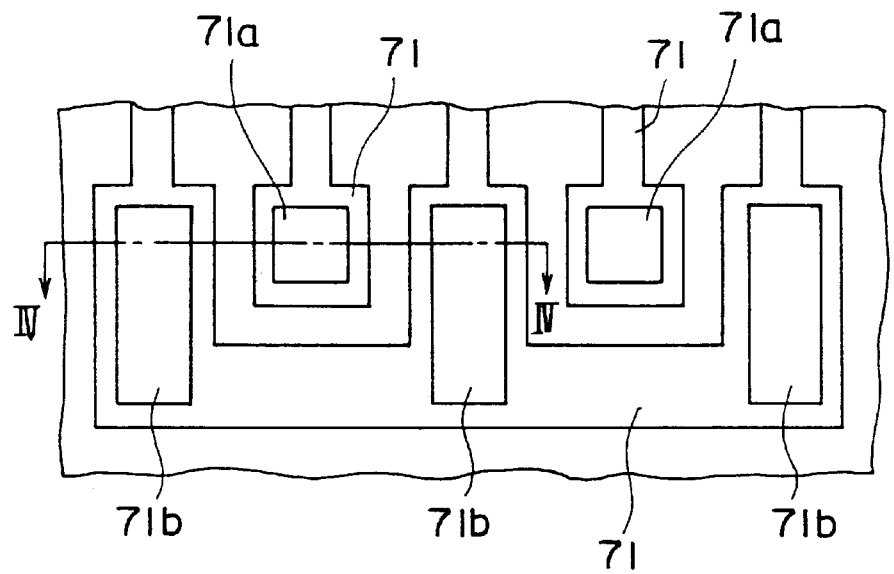
FIG. 16(a) is a plan view showing an insulating protective film of pads of a semiconductor device according to an 11th embodiment of the present invention.
Figure 16B:
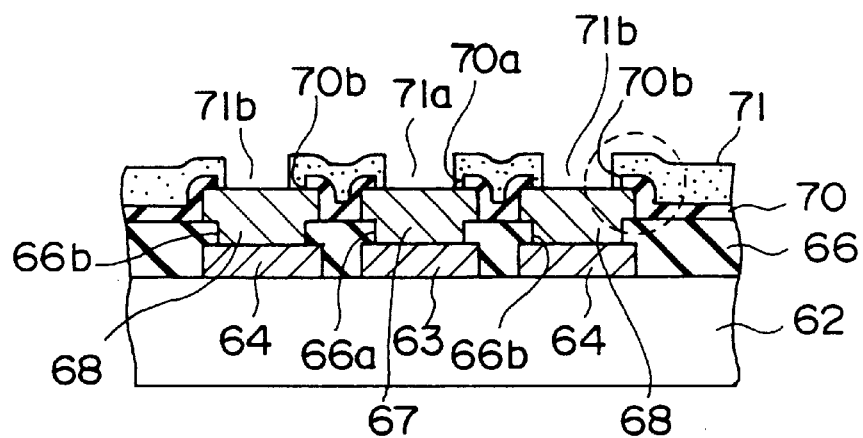
FIG. 16(b) is a sectional view taken along a line IV—IV in FIG. 16(a) showing the relationship among electrodes and pads in the semiconductor device.

In FIG. 16(a) and FIG. 16(b), a gate leader electrode 63 and source leader electrodes 64 led out of the gate and the source of a field effect transistor are formed on a semiconductor layer 62. The gate leader electrode 63 is composed of a material forming a Schottky junction with the semiconductor layer 62 such as a refractory metal, a refractory metal compound or aluminum. Further, the source leader electrode 64 is formed of a material making ohmic contact with the semiconductor layer 62 such as gold or germanium/gold.

The gate extending electrode 63 and the source extending electrodes 64 are covered by an insulating film 66, and a gate pad 67 and source pads 68 are formed on the insulating film 66. Further, the gate pad 67 is connected to the gate extending electrode 63 through an opening portion 66a of the insulating film 66, and the source pads 68 are connected to the source extending electrodes 64 through opening portions 66b of the insulating film 66.

The gate pad 67 and the source pads 68 are covered by a silicon nitride film (inorganic insulating film) 70, and opening portions 70a and 70b for exposing respective central regions of the gate pad 67 and the source pads 68 are formed in the silicon nitride film 70.

Figure 16C:
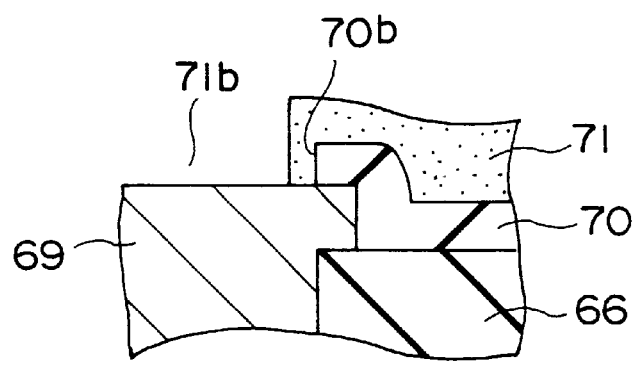
FIG. 16(c) is an enlarged sectional view of a portion of FIG. 16(b) surrounded with a broken line.

Further, photosensitive polyimide 71 is formed on the silicon nitride film 70. Patterning is applied to the polyimide 71 through exposure and development, thereby to form opening portions 71a and 71b in respective central regions of the gate pad 67 and the source pads 68. Further, the polyimide 71 is pushed out a little to the center than the silicon nitride film 70 on respective pads 67 and 68 as shown in a partly enlarged figure of FIG. 16(c), thus covering the edge portion of the silicon nitride film 70 completely. Therefore, the edge portion of the silicon nitride film 70 cannot be seen from the outside.

When the edge of the silicon nitride film 70 on the gate pad 67 and the source pad 68 is covered with polyimide 71 as described above, the effect of deterring intrusion of water into a semiconductor device has been improved. This is conceived due to the reason that adhesion between polyimide and metal is strong.

Besides, similar effects have also been obtained even when resist or the other organic resin is used in place of polyimide.

(The 12th embodiment)

Corner portions of the pad may be mentioned as a part where water is liable to intrude into the silicon nitride film covering the pads. This fact has been described already in the sady in the section of the prior art.

Now, as shown in FIG. 17 for instance, the parts of the angles of the gate pad 67 and in the vicinity thereof are pushed further inside than other regions in the silicon nitride film 70 covering the gate pad 67 so as to form a configuration for covering extensively. In this case, a plane configuration of an opening portion 70a formed on the square gate pad 67 shows an octagon.

When such a structure was adopted, water was prevented from intruding in between the silicon nitride film 70 and the gate pad 67 from the opening portion 70a. Besides, intrusion of water may also be prevented by adopting a similar structure with respect to an opening portion (not illustrated) on the source pad or the drain pad.

It produces similar effects when the edge of the pad is covered with an insulating film such as $SiO_2$, PSG and SOG in place of the silicon nitride film to form the opening portion on the pad into a configuration such as described above.

Besides, the external shape of the opening portion 70a is not limited to an octagon so far as it is a polygon having an interior angle larger than 90°, but an effect of preventing intrusion of water from the outside is also obtainable with this.

Further, intrusion of water in between the silicon nitride film and the gate pad is prevented surely by covering the edge of such polygonal opening portion with organic resin.

(The other examples)

In the embodiments described above, electrodes of a MESFET and the pads connected thereto have been described. However, it is not limited to a gate electrode of a MESFET to cover the side portion of an electrode with a metal protective film that is hard to react on water or does not react, but it is adopted in electrodes of semiconductor elements such as a HEMT, a MOSFET and others, wirings connecting between elements or general pads. With this, a leakage current caused by corrosion reaction is deterred. In a HEMT, when it is assumed that the reference numeral 44 represents a silicon doped AGaAs layer and the reference numeral 43 represents an undoped GaAs layer in FIG. 13 for instance, two-dimensional electron gas is formed in the vicinity of the boundary between these layers.

Furthermore, a structure that the edge of the silicon nitride film covering the periphery of the pad is covered further with organic resin is also adopted for general pads.

Further, GaAs and AlGaAs have been mentioned as the above-mentioned semiconductor material that the electrode forms a Schottky junction, which, however, is not limited thereto, but a compound semiconductor such as InP and InGaAs or a semiconductor such as silicon and germanium may also be used.

What is claimed is:

1. A semiconductor device comprising:
   a semiconductor layer;
   a first metal layer formed on the semiconductor layer, said first metal layer being made from a first material which is capable of forming a Schottky contact with the semiconductor layer;
   a second metal layer formed on the first metal layer, said second metal layer being made from a second material which has lower resistivity than that of the first material; and
   a metallic protective film formed to cover at least a side of the first metal layer, said metallic protective film being made from a third material which has smaller ionization tendency than that of the first material.

2. The semiconductor device according to claim 1, further comprising a first insulating film formed on the semiconductor layer, said first insulating film having an opening through which said first metal layer is formed on the semiconductor layer.

3. The semiconductor device according to claim 2, further comprising a second insulating film formed to cover said second metal layer, said metallic protective film and said first insulating film.

4. The semiconductor device according to claim 1, wherein the third material is selected from the group consisting of gold, platinum, palladium, a gold alloy, a platinum alloy, a palladium alloy and lanthanum hexaboron.

5. The semiconductor device according to claim 1, wherein the first material is selected from the group consisting of a refractory metal, a refractory metal compound and aluminum.

6. The semiconductor device according to claim 5, wherein the refractory metal compound is selected from the group consisting of a refractory metal silicide, refractory metal aluminum and a refractory metal nitride.

7. The semiconductor device according to claim 5, wherein the refractory metal is selected from the group consisting of tungsten, molybdenum and titanium.

8. The semiconductor device according to claim 1, wherein said second material is selected from the group consisting of gold, platinum, a gold alloy and a platinum alloy.

9. The semiconductor device according to claim 3, wherein said first insulating film is made from silicon dioxide and said second insulating film is made from silicon nitride.

10. The semiconductor device according to claim 1, wherein said semiconductor layer is made of an n or p type GaAs.

11. The semiconductor device according to claim 1, wherein said first metal layer and second metal layer form a gate electrode of a field effect transistor.

12. The semiconductor device according to claim 11, wherein the section of said gate electrode has a rectangular shape or a T-shape.

13. The semiconductor device according to claim 1, wherein said first metal layer and second metal layer form a bonding pad.

14. The semiconductor device according to claim 1, further comprising an adhesion strengthening metal film formed between said first metal layer and said metallic protective film.

15. The semiconductor device according to claim 14, wherein said adhesion strengthening metal film is made of titanium.

* * * * *